(12) United States Patent
Sogard et al.

(10) Patent No.: US 7,876,452 B2
(45) Date of Patent: Jan. 25, 2011

(54) INTERFEROMETRIC POSITION-MEASURING DEVICES AND METHODS

(75) Inventors: Michael R. Sogard, Menlo Park, CA (US); Bausan Yuan, San Jose, CA (US); Masahiko Okumura, Tokyo (JP); Yosuke Shirata, Saitama (JP); Kiyoshi Uchikawa, Tsukuba (JP); Saburo Kamiya, Tokyo (JP); Akikazu Tanimoto, Yokohama (JP)

(73) Assignee: Nikon Corporation, Tokyo (JP)

( * ) Notice: Subject to any disclaimer, the term of this patent is extended or adjusted under 35 U.S.C. 154(b) by 81 days.

(21) Appl. No.: 12/042,253

(22) Filed: Mar. 4, 2008

(65) Prior Publication Data

US 2008/0291464 A1    Nov. 27, 2008

Related U.S. Application Data

(60) Provisional application No. 60/905,177, filed on Mar. 5, 2007, provisional application No. 60/924,419, filed on May 14, 2007, provisional application No. 60/924,420, filed on May 14, 2007.

(51) Int. Cl.
  *G01B 11/02*    (2006.01)
(52) U.S. Cl. ..................................... 356/500
(58) Field of Classification Search ............... 356/496, 356/498, 500
  See application file for complete search history.

(56) References Cited

U.S. PATENT DOCUMENTS

| 4,814,625 | A | 3/1989 | Yabu | |
|---|---|---|---|---|
| 5,141,318 | A | 8/1992 | Miyazaki et al. | |
| 5,552,888 | A | 9/1996 | Sogard et al. | |
| 5,708,505 | A | 1/1998 | Sogard et al. | |
| 5,801,832 | A * | 9/1998 | Van Den Brink | 356/500 |
| 5,870,197 | A | 2/1999 | Sogard et al. | |
| 6,160,628 | A * | 12/2000 | Inoue | 356/500 |
| 6,211,965 | B1 * | 4/2001 | Tsuchiya et al. | 356/493 |
| 6,498,352 | B1 | 12/2002 | Nishi | |
| 7,336,369 | B2 * | 2/2008 | Eckes et al. | 356/500 |

OTHER PUBLICATIONS

U.S. Appl. No. 60/856,630, filed Nov. 3, 2006, Sogard, et al.

* cited by examiner

*Primary Examiner*—Michael A Lyons
(74) *Attorney, Agent, or Firm*—Klarquist Sparkman, LLP

(57) ABSTRACT

Process tools and methods are disclosed that involve interferometric and other measurements of movements and positions relative to a process position, such as movements and positions of a stage relative to a lithographic optical system. An exemplary apparatus includes a stage that places a workpiece relative to the tool, and that is movable in at least one direction relative to the tool. At least one first interferometer system is situated relative to the stage to determine stage position in a movement direction relative to the process position. A movement-measuring device determines displacement of the tool from the process position. Using data from the interferometer system and movement-measuring device a processor determines a position of the stage relative to the tool. The processor also corrects the determined position for displacement of the tool.

39 Claims, 10 Drawing Sheets

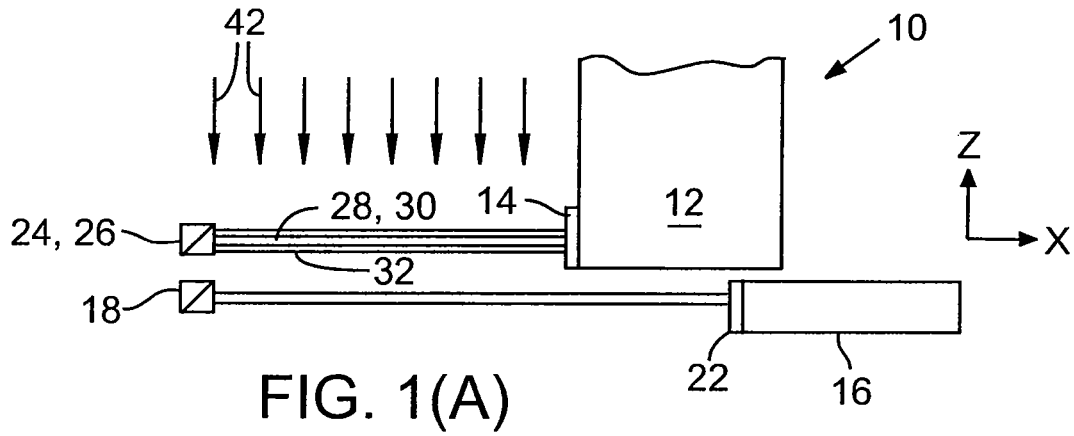
FIG. 1(A)
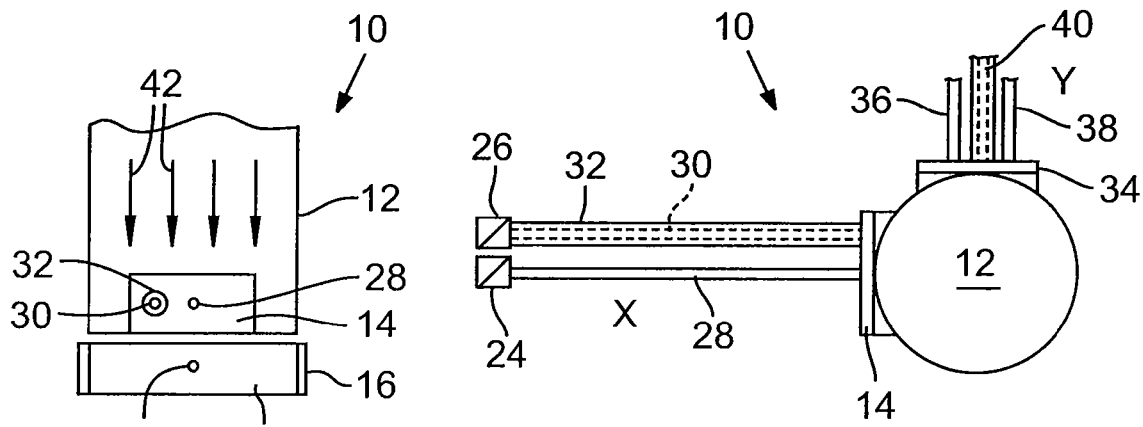
FIG. 1(C)
FIG. 1(B)
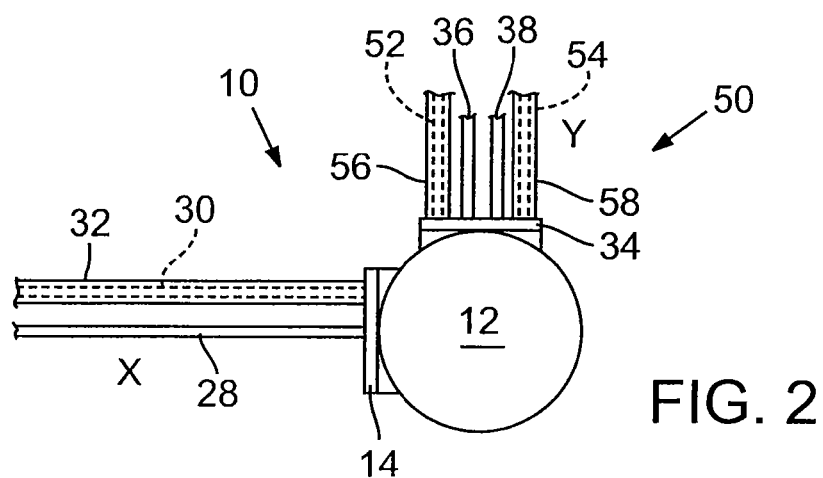
FIG. 2

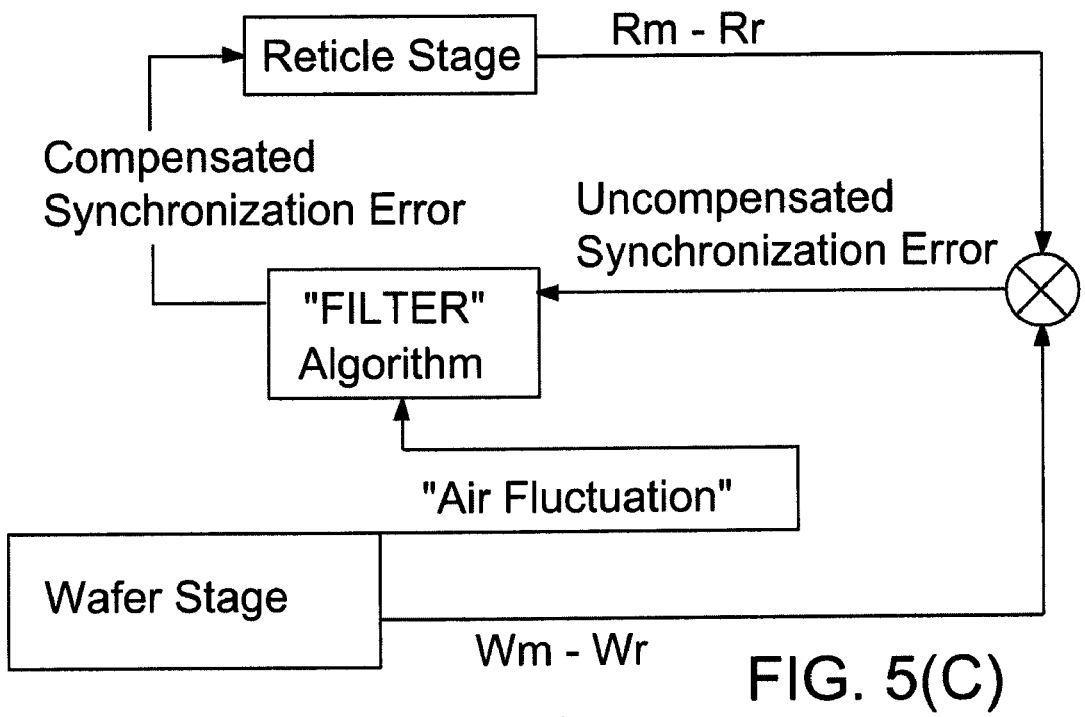
FIG. 5(C)
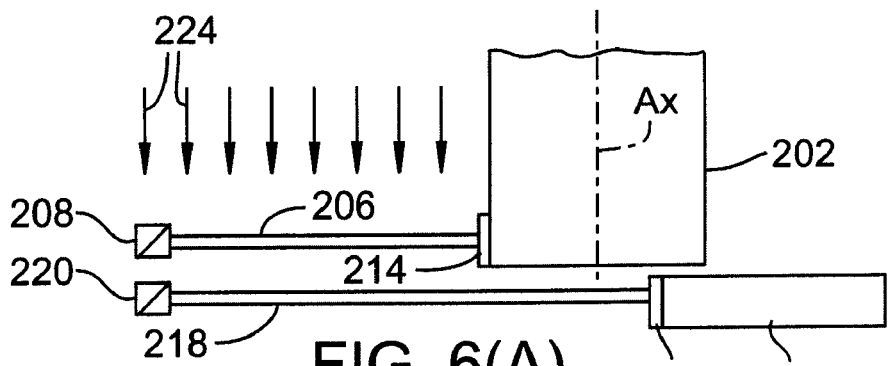
FIG. 6(A) (Prior Art)
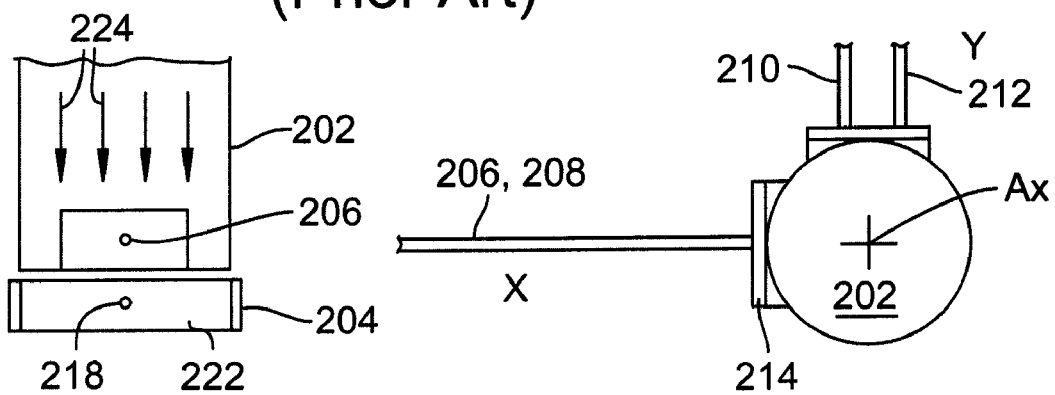
FIG. 6(B) (Prior Art)
FIG. 6(C) (Prior Art)

INTERFEROMETRIC POSITION-MEASURING DEVICES AND METHODS

CROSS-REFERENCE TO RELATED APPLICATION

This application claims priority to, and the benefit of, U.S. Provisional Application No. 60/905,177, filed on Mar. 5, 2007, No. 60/924,419, filed on May 14, 2007, and No. 60/924,420, filed on May 14, 2007, all of which are incorporated herein by reference in their respective entireties.

FIELD

This disclosure pertains to, inter alia, interferometric position-measuring devices and methods for determining position of a first object relative to a second object or relative to a location, such as, for example, position of a stage relative to an optical system or to an axis of the optical system in a microlithographic exposure system.

BACKGROUND

The proper functioning of various systems and apparatus relies upon an ability to position an object, such as a workpiece, accurately and precisely, such as relative to a machining tool, processing tool, or imaging device. Object placement is perhaps most critical in lithographic exposure systems used in the fabrication of microelectronic devices, displays, and the like. These systems, called microlithography systems, must satisfy extremely demanding criteria of image-placement, image-resolution, and image-registration on the lithographic substrate. For example, to achieve currently demanded feature sizes, in projected images, of 100 nm or less on the substrate, placement of the substrate for exposure must be accurate at least to within a few nanometers or less. Such criteria place enormous technical demands on stages and analogous devices used for holding and moving the substrate and for, in some systems, holding and moving a pattern-defining body such as a reticle or mask.

The current need for stages capable of providing extremely accurate placement and movement of reticles, substrates, and the like has been met in part by using laser interferometers for determining stage position. Microlithography systems typically use at least two perpendicular sets of laser interferometer beams to measure the horizontal (x-y) two-dimensional position of an x-y stage. The stage and interferometer system are enclosed in an environmental chamber containing a flow of highly filtered and temperature-controlled air, in part to prevent deposition of particulate matter on the lithographic substrate or on the reticle. The environmental chamber thus assists in maintaining the index of refraction of the air at a substantially constant value by maintaining constancy of the air temperature.

In many types of microlithography systems, a projection-optical system ("projection lens") is situated between a reticle stage and a substrate (wafer) stage. The projection lens is rigidly mounted on a rigid, vibration-isolation support to suppress motion of the projection lens. The projection lens must remain very still during the making of lithographic exposures from the reticle to the substrate. However, the projection lens may exhibit a small amount (typically several nanometers or less) of motion caused mainly by vibrations. Among various sources of these vibrations are circulation of coolant in the projection lens (which is temperature-regulated in this manner), reactionary forces to stage motion, and the like. These movements cause corresponding changes in the length of the propagation pathway of the reference beam. Consequently, data obtained by the measurement beam are uncorrected with respect to lens motion. As the performance standards of microlithography systems become stricter, reducing the effects of these motions on position measurements is becoming more important.

In view of the importance of aligning the stages very accurately with the projection lens, the projection lens is used as a reference body for determining the position of the stage. In other words, the respective position of each stage is determined relative to the projection lens. For such a purpose, reference mirrors for reflecting reference interferometer beams are mounted to the column containing the projection lens. Usually, two reference mirrors (at right angles to each other) are provided on the projection lens, one for reflecting x-direction reference interferometer beams and the other for reflecting y-direction reference interferometer beams.

This scheme is illustrated in FIGS. 6(A)-6(C), showing a projection lens 202, a stage 204 (e.g., wafer stage), one x-direction "fixed" reference beam 206 produced by an x-direction reference interferometer 208, and two y-direction reference beams 210, 212. The x-direction reference beam 206 is incident on the mirror 214, and the y-direction reference beams 210, 212 are incident on the mirror 216. The mirrors 214, 216 are at right angles to each other and are mounted on or at least associated with the projection lens 202. Associated with the x-direction reference beam 206 is an x-direction measurement beam 218, produced by an x-direction measurement interferometer 220, incident on a mirror 222 on the stage 204. Similarly, associated with each y-direction reference beam 210, 212 is a respective y-direction measurement beam (not shown) incident on the stage 204. These two y-direction measurement beams are used for detecting yaw of the stage 204 (i.e., motions of the stage about the axis Ax extending in the z-direction).

Additional interferometer beams may be present to provide corrections to the stage position from other motions of the stage, such as pitch, roll, or height. These will not be considered here explicitly.

Stage position in the x-direction, for example, can then be corrected for small motions of the lens, by subtracting the lens x-position, determined from the x-direction reference beam 206, from the stage x-position. If the stage is traveling purely in the x-direction, the length of the x-direction reference beam 206 can be subtracted directly from the x-direction measurement beam 218. If the stage motion is not purely in the x-direction, the length of the x-direction reference beam 206 is subtracted from the x-displacement component, which is calculated from measurement information obtained from the stage-measurement interferometers. This correction method assumes any changes in the path-length of the x-direction reference beam 206 are caused by motion of the projection lens. However, if the optical path-length of the x-direction reference beam 206 changes because the optical properties of the ambient atmosphere change, an erroneous correction to the position of the projection lens will be produced.

Furthermore, any fluctuations in the optical path-length of the x-direction measurement beam 218, from changes in the optical properties of the ambient atmosphere, will cause further errors in the stage position.

The adverse effects of air currents and air-density fluctuations on interferometer beams are known. For example, air experiencing local variations in temperature exhibits corresponding variations in density and refractive index. If air turbulence is occurring in the propagation pathway of an interferometer beam, the turbulence can mix regions, or cells, of air of different refractive indices, producing changes in the optical path length of the beam, which degrade the accuracy and precision of positional measurements determined by the interferometer. Various approaches have been adopted to address this problem, notably by enclosing the stages and interferometers in an environmental chamber, as noted above, and by producing and maintaining improved (gentle laminar flow and constant temperature) air circulation in the vicinity of the interferometers and stages. Exemplary approaches are discussed in, for example, U.S. Pat. No. 4,814,625 to Yabu, U.S. Pat. No. 5,141,318 to Miyazaki, and U.S. Pat. No. 5,870,197 to Sogard et al., all incorporated herein by reference. In general, referring again to FIGS. 6(A)-6(C), the corresponding reference and measurement beams 206, 218 are situated as close as possible to each other and have similar respective lengths. The beams 206, 218 are situated in a stream of air (arrows 224) flowing from the reference beam(s) to the measurement beam(s). The air flow 224 is usually at right angles to the beams 206, 218. However, these approaches do not completely eliminate the problem of air-density fluctuations in the beam paths of the interferometers.

Therefore, there is a need for devices and methods for, in the context of interferometrically measuring position of a stage, correcting for fluctuations in the optical path lengths of the interferometer beams.

SUMMARY

The foregoing and other needs are addressed by apparatus and methods within the scope of the invention, as disclosed herein. The invention has several aspects. According to one aspect, process apparatus are provided. An embodiment of the process apparatus comprises a process tool that is situated at a process position. The process position is usually a particular position at which the process tool is used to perform a subject process on a thing such as a workpiece. The process position is a reference position for the workpiece relative to the process tool. Placing the workpiece relative to the process tool is typically performed using a stage that is movable in at least one movement direction relative to the process tool. Here, "stage" is any of various devices that hold the workpiece and that movably position the workpiece relative to the process tool. This embodiment includes at least one first interferometer system situated relative to the stage to determine a position of the stage in a movement direction of the stage relative to the process position. This embodiment also includes a movement-measuring device situated relative to the process tool to determine a displacement of the process tool from the process position. The interferometer system and movement-measuring device are coupled to a processor configured (e.g., programmed) to determine a position of the stage, relative to the process tool. The processor also is configured to correct the determined position for displacement of the process tool. Thus, the position of the stage relative to the process tool is determined with greater accuracy and precision because at least one variable (movement of the process tool independently of the stage) is eliminated.

An example process tool is an optical system, relative to which the stage positions a workpiece. A more specific example is a microlithographic system, of which the optical system is a projection-optical system, and the stage is at least one of a reticle stage (holding a reticle or mask) and a substrate stage (holding a wafer or other lithographic substrate).

The movement-measuring device for the process tool can be or can comprise an interferometer system that, along with the first interferometer system, is coupled to the processor. These interferometer systems desirably each comprise a respective measurement beam and at least one respective reference beam. In some embodiments, one or both interferometer systems includes at least a second respective reference beam that provides the interferometer system with multiple reference beams. The multiple reference beams advantageously can be situated and used in a redundant manner for isolating and determining accuracy-reducing effects such as air currents in the pathways of the interferometer beams.

Another interferometer system (with its own at least one measurement beam and at least one reference beam) can be situated relative to the stage to determine stage position in a direction substantially orthogonal to the movement direction, relative to the process position of the process tool.

In embodiments comprising multiple interferometer systems, the first interferometer system can include a first reference interferometer and a second interferometer system can include a second reference interferometer. Beams of the first and second reference interferometers can be directed to reflect from a mirror associated with the process tool. The second reference interferometer can be redundant to the first reference interferometer sufficiently to distinguish motion of the process tool relative to the process position from at least one other possible source of error (e.g., effects of air currents in interferometer beam paths) in the determination of position of the stage. At least one of the first and second reference interferometers can include a beam that is substantially isolated from air currents that otherwise could cross a pathway of the beam. One way in which the processor can be configured to determine a difference in data produced by the first and second interferometer systems is based on respective frequency spectra of fluctuations exhibited by the first and second interferometer systems.

According to another aspect, microlithography systems are provided. An embodiment comprises an optical system and a stage that is movable in at least a first movement direction relative to the optical system. The embodiment also includes a stage-position-measurement interferometer system that is situated relative to the stage and that produces at least one respective reference beam and at least one respective measurement beam. At least the measurement beam is directed in the first movement direction and reflects from a surface moving with the stage. The stage-position-measurement interferometer system produces, from interference of its reference and measurement beams, stage-position data concerning stage position in the first movement direction. This embodiment also includes a first reference interferometer system that is situated relative to the optical system and that produces at least one respective reference beam and at least one respective measurement beam. At least the measurement beam is directed in the first movement direction for reflection from a surface associated with the optical system. The first reference interferometer system produces, from interference of its reference and measurement beams, first reference data for the stage-position data. This embodiment also includes a second reference interferometer system that is situated relative to the optical system and that produces at least one respective measurement beam directed in the first movement direction for reflection from a surface associated with the optical system. The second reference interferometer system produces, from interference of its at least one measurement beam with a reference beam, second reference data for the stage-position data. The interferometer systems are coupled to a processor so that the processor can receive the stage-position data, the first reference data, and the second reference data from the interferometer systems. The processor determines the position of the stage, in the first movement direction, relative to the optical system and corrects the determined position for any displacement of the optical system.

Another aspect of the invention is directed to various method embodiments. One embodiment is applicable in a process system, and is directed to determining position of a stage that is movable in at least one movement direction relative to a process tool situated at a process position. In the method a position of the stage is interferometrically determined in the movement direction relative to the process position. Displacement of the process tool from the process position is determined, and the position of the stage, relative to the process tool, is corrected for the displacement of the process tool.

Another embodiment method is applicable in a lithography system, and is directed to a method for determining position of a first stage that is movable in at least one movement direction relative to a reference position of an optical system of the lithography system. In the method at least one position-measurement beam and at least one reference beam of a stage-position-measurement interferometer are directed to the first stage to determine a position of the first stage in the movement direction relative to the reference position. At least one beam of an optical-system reference interferometer is directed along a pathway to and from the optical system. From the optical-system reference interferometer, an interferometer signal is produced that includes data on air fluctuation occurring in the pathway. Based on the interferometer signal, an air-fluctuation correction is determined. The air-fluctuation correction is applied to the determined position of the first stage to determine a corrected position of the first stage relative to the reference position.

The foregoing and other embodiments achieve one or more of the following: (a) use of information from a process-tool reference interferometer beam to estimate air-fluctuation corrections to be applied to data from the measurement beam of a stage-position interferometer; (b) use a corrected stage interferometer signal to correct first-stage-second-stage synchronization errors by applying correction to either the first stage or the second stage; and (c) use of a processor to separate motion of a process tool from air fluctuations in reference interferometer beam signals.

The foregoing and additional features and advantages of the invention will be more readily apparent from the following detailed description, which proceeds with reference to the accompanying drawings.

BRIEF DESCRIPTION OF THE DRAWINGS

FIGS. 1(A)-1(C) are respective orthogonal views of a first representative embodiment.

FIG. 2 is a view, from above, of a second representative embodiment.

FIG. 5(C) is a control diagram of stage-stage synchronization according to a second embodiment.

FIGS. 6(A)-6(C) are respective orthogonal views of a conventional manner of interferometrically determining position of a stage relative to a projection lens.

DETAILED DESCRIPTION

Figure 3A:
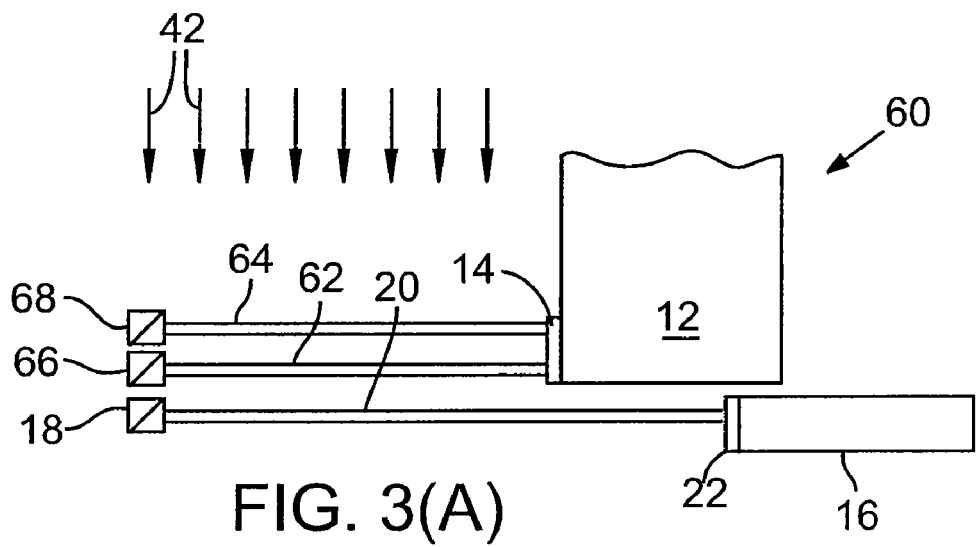
FIGS. 3(A)-3(C) are respective orthogonal views of a third representative embodiment.

This disclosure is set forth in the context of multiple representative embodiments that are not intended to be limiting in any way.

In the following description certain words are used, such as "upward," "downward," "vertical," "horizontal," and the like. These words are used to provide clarity of the descriptions when read in the context of the drawings. Whereas these words are useful in understanding relative relationships, they are not intended to be limiting. For example, a device depicted in a drawing readily can be turned upside down, resulting in an "upper" surface becoming a "lower" surface, and vice versa.

As mentioned earlier, an approximately laminar flow of temperature-controlled air is propagated through the interferometer beams to minimize fluctuations in the interferometer optical path lengths and thus improve the accuracy of the interferometric measurements. However, in practice some fluctuations remain that limit the interferometer accuracy, so improvements beyond that provided by the laminar air-flow are needed. In one embodiment, referring to FIG. 6(A), in some interferometer configurations, air-density fluctuations measured in the x-direction reference beam 206 propagating to the reference mirror 214 on the projection lens 202 are used for at least partially correcting air-density fluctuations in the corresponding x-direction measurement beam 218 propagating to the mirror 222 on the stage 204. This approach is based on an expectation that fluctuations in the reference-beam interferometer signal, caused by cells of air of varying temperature in the air-flow 224 passing through the x-direction reference beam 206, will produce a similar signal in the corresponding optical path length of the respective x-direction measurement beam 218 (after a time-delay that is related to the velocity of the air-flow and the separation between the reference beam 206 and respective measurement beam 218). Thus, fluctuations in the measurement beam are estimated from corresponding fluctuations in the reference beam. This is described further in U.S. Provisional Patent Application Nos. 60/924,419 and 60/924,420, incorporated herein by reference, to which the instant application claims priority.

A general method of predicting the measurement beam fluctuations from the reference beam is to apply a filter to the reference-beam signal. The filter applies mathematical operations to a time sequence of reference-beam measurements to obtain the prediction. The filter may be linear or non-linear. The filter properties are obtained from a calibration procedure, where independent means of locating the stage position are employed.

As noted, the stage 204 moves relative to the projection lens 202. For most positions of the stage 204 relative to the projection lens 202, the measurement beam 218 is shorter or longer than the reference beam. As a result, a significant or even substantial portion of the measurement beam 218 may not have a corresponding portion in the respective reference beam 206 with which to correlate with respect to air-flow properties. The different interferometer beam path lengths can have an adverse effect on this approach. Calibration of the algorithm for different stage positions may overcome this effect to some extent, but this is not entirely satisfactory.

Furthermore, air-flow properties are never completely stable from one location to another, and the instantaneous flow velocity between the reference and measurement beams will fluctuate somewhat. Thus, the delay time associated with passage of a cell of air between the reference and measurement beams will vary. Also, cells of air with varying refractive indices may change in size or shape during their passage between the beams. Filters with fixed properties cannot deal with such variations. An alternative scheme for predicting fluctuations in the measurement beam uses an adaptive filter based on algorithms described in Provisional Patent Application No. 60/856,630, filed on Nov. 3, 2006, and incorporated herein by reference. This scheme is summarized below.

Air fluctuations in one interferometer beam can be predicted from measurements in (an)other beam or beams using adaptive filters. An adaptive filter can predict a future value of a desired quantity based on input information u(i), using past values of desired outputs d(i) (which are known because they occurred in the past), where the index i represents a time step, to adjust the filter's properties appropriately. As conditions change, the filter adapts its properties to the changes in the behavior of the input information. Using notation from the '630 application, if the desired output at time step i is d(i), it is predicted from a sequence of M past values of past input information u(i) using the adaptive filter weights $\underline{w}(n)$, wherein $\underline{w}(n)$ is a vector of length M:

$$d(i)=\underline{w}^T(n)\cdot u(i). \quad (1)$$

where the superscript signifies a transpose operation to the vector. The predicted value has an error e(i) associated with it:

$$e(i)=d(i)-\underline{w}^T(n)\cdot u(i). \quad (2)$$

The weights are determined from minimization of a cost function E(n) derived from the estimated error e(i):

$$E(n) = \sum_{i=1}^{n} \lambda^{n-i}|e(i)|^2 = \sum_{i=1}^{n} \lambda^{n-i}|d(i) - \underline{w}^T(n)\cdot \underline{u}(i)|^2, \quad (3)$$

The parameter λ (wherein λ<1) is called the forgetting factor. λ determines how fast the filter can adapt to changing conditions.

There is a desired value d(i) at every time step i. d(i) may be some function of $\underline{u}(i)$, or it may represent a future prediction, i.e., d(i)≡u(i+k), if it is predicting k time steps into the future. Since the most recent input data point is u(i), the latest available desired value is u(i)=d(i−k), and the latest cost function available to update the filter weights is E(n−k). By minimizing the cost function, the adaptive filter weights are determined such as to provide the best estimate of the prediction.

For a fixed interferometer path length, the adaptive filter is very successful at predicting the air fluctuation in one interferometer beam from another one that is on the upstream side of an air-flow. However, in predicting the fluctuations for a moving mirror, things are more complicated, because the air fluctuations have to be separated from the motion of the mirror. This requires separating past values of the interferometer fluctuations from the rigid-body motion of the stage mirror, by means of an estimation model. Because the air fluctuations are limited to frequencies below about 10 Hz, an estimation of high-frequency behavior of the stage, which would be difficult to determine, is unnecessary. One means of estimating the real-time (low-frequency) motion of the stage is by constructing adaptive moving averages of the stage motion, as described in the '630 application. An alternative method would be to construct a low-frequency Kalman filter model of the moving stage.

The above approach implicitly assumes that changes to the signal from the reference interferometer are caused by air fluctuations. However the lens may also be moving and changing the interferometer path length.

When interferometrically measuring stage position relative to a projection lens or other optical system, there are various ways in which corrections can be made for motions of the projection lens. Certain embodiments employ any of various non-interferometric sensors, such as capacitive sensors and/or accelerometers, mounted on or associated with the projection lens to obtain data on the position of the projection lens. Data obtained by these sensors regarding projection-lens motion are used to correct the interferometer data produced by interferometers used for measuring stage position. These types of lens-motion sensors are adequate in certain embodiments, but in other embodiments these sensors do not have sufficient accuracy and precision to measure displacements in the range of ten nanometers to less than one nanometer, for example.

In embodiments in which greater measurement accuracy is required, motions of the projection lens are determined interferometrically. In conventional systems for measuring stage position in one direction relative to a projection lens, as discussed earlier, the beam of a stage-position reference interferometer is directed to a mirror on the projection lens, and the stage position in the same direction is measured, by a corresponding stage-position measurement interferometer, relative to position data obtained by the stage-position reference interferometer. The stage-position reference interferometer is a "fixed" interferometer, and its beam remains nominally fixed in length. The beam of the stage-position measurement interferometer undergoes a length change whenever the stage is moved in the beam direction. The beam of the stage-position measurement interferometer is parallel to the beam of the stage-position reference interferometer; thus, both beams lie in a plane. The plane may be parallel to the flow of air 42, or the plane may be at an angle. The position data obtained by the stage-position reference interferometer are subtracted from the position data obtained by the stage-position measurement interferometer to provide the stage position relative to the projection lens.

In certain embodiments, and disregarding for now any need to determine or account for rotation of the projection lens, a second fixed reference interferometer is included for each measurement direction. Each second reference interferometer is effectively a redundant reference interferometer that is used for obtaining data on movements of the projection lens that are subtracted from the data obtained by the corresponding stage-position reference interferometer. Each second reference interferometer directs its beam to a mirror mounted on the projection lens, desirably the same mirror as used with the respective stage-position reference interferometer. The beam of the second reference interferometer desirably is parallel to the beam of the corresponding stage-position reference interferometer. In certain embodiments the beam of the second reference interferometer is in the same plane in which lie the respective beams of the stage-position reference interferometer and stage-position measurement interferometer; in other embodiments the beam of the second reference interferometer is in a different plane.

In view of the extremely small amounts of motion typically experienced by the projection lens, it is important to account for (and eliminate if possible) effects of air-density fluctuations on the second reference beam. Otherwise, it will not be possible to distinguish interferometer perturbations caused by air-density fluctuations from interferometer perturbations caused by lens motion or other vibrations.

One manner in which this can be done is to enclose the second reference beam in a temperature-controlled sheath or analogous beam conduit. Beam sheaths are discussed for example in U.S. Pat. No. 5,708,505, incorporated herein by reference. The sheath isolates the beam from air-density (e.g., air-temperature) fluctuations; thus, any fluctuation exhibited by a second reference interferometer having a sheathed beam is due to motion of the projection lens. In some embodiments the sheath is separated from the projection lens by a small gap; in other embodiments the sheath is closed and evacuated or filled with a gas. Additional relevant properties of beam sheaths and tubes are discussed in, e.g., U.S. Pat. No. 5,552,888 to Sogard et al., incorporated herein by reference.

An example embodiment 10 is shown in FIGS. 1(A)-1(C), showing a projection lens 12, a mirror 14 mounted to the projection lens, a substrate stage 16, and a stage-position measurement interferometer 18 that directs a beam 20 in the x-direction to a mirror 22 mounted on the stage 16. In the x-direction, a first reference interferometer 24 and a second reference interferometer 26 direct respective beams 28, 30 in the x-direction to the mirror 14. The first reference interferometer 24 serves as an x-direction stage-motion reference, and the second reference interferometer 26 is a redundant reference interferometer for the x-direction. The second reference interferometer 26 serves as an x-direction lens-motion reference for the first reference interferometer 24. The respective beams 28, 30 produced by the x-direction reference interferometers 24, 26 are shown in FIGS. 1(B) and 1(C). The beam 30 is encased in a sheath 32 to eliminate the effects of air currents on this beam. Thus, as shown, the beam 30 need not be in the same plane as the beams 20, 28. For the beams 20, 28, air currents are made as uniform as practicable by air downflow (arrows 42). The plane of the beams 20, 28 encountering the air downflow desirably is parallel to the direction of the air downflow. Desirably, measurement beams are directly below the reference beams, but not necessarily one-to-one.

In FIG. 1(B), additional interferometer beams are incident, along the y-direction, on a mirror 34 mounted to the projection lens 12. The mirror 34 is oriented 90° from the mirror 14. The additional beams include a first y-direction reference interferometer beam 36 and a second y-direction reference interferometer beam 38. The y-direction reference beams 36, 38 serve as references for respective y-direction stage-position-measurement interferometers (not shown but situated beneath the beams 36, 38 in FIG. 1(B)). Thus, the y-direction stage-position measurement interferometers provide data concerning yaw of the projection lens 12. Also extending in the y-direction is a sheathed reference beam 40 for use as a redundant reference beam, specifically as a y-direction lens-motion reference for the reference beams 36, 38. The sheathed reference beam 40 reflects from the mirror 34 on the projection lens 12. In each direction (x and y) the respective sheathed reference beam 30, 40 is unaffected by air currents but sensitive to movements of the projection lens 12. The corresponding non-sheathed stage-position reference beams 28, 36, 38 are sensitive to both air currents and lens movements. So, in each direction, the difference in data obtained by the non-sheathed reference beam(s) versus data obtained by the corresponding sheathed reference beam(s) provides data on projection-lens movement independent of air-density fluctuations.

A single sheathed reference beam 40 for the y-direction is shown in FIG. 1(B). If significant yaw of the projection lens 12 is possible, an additional reference interferometer beam can be added in at least one direction (e.g., in the y-direction). An embodiment 50 is shown in FIG. 2, which depicts a first y-direction reference beam 52 and a second y-direction reference beam 54. These reference beams are enclosed in respective sheaths 56, 58. Thus, not only directional displacement of the projection lens 12 can be determined, but also yaw of the projection lens about its longitudinal axis can be determined.

Beam sheaths are complicated devices. The need for sheaths can be avoided by utilizing, in lieu of the sheathed-beam interferometers, one or more redundant reference interferometers to isolate motions of the projection lens and other vibrations from other variables such as air-density fluctuations in the propagation pathways of the interferometer beams. Consider an example in which two (i.e., first and second) reference interferometers are provided for a particular movement direction such as the y-direction. In the movement direction these reference interferometers provide reference data for at least one position-measurement interferometer. A prediction can be made that a fluctuation experienced by the beam of the first reference interferometer due to an air-density fluctuation also will be experienced in substantially the same way by the second reference beam, using prediction methods described in the '630 provisional application, cited above, and incorporated herein by reference. The prediction is made by providing a flow of air or other gaseous fluid across the beam paths, and utilizing an algorithm that compensates for air-propagation delays between the two reference beams. By using at least one redundant interferometer reference beam (in this instance, the second reference beam, desirably situated in the same plane as the first reference beam and measurement beam, which desirably is parallel to the air downflow), any fluctuations or changes experienced by the second reference beam simultaneously with the first reference beam can likely be attributed to a factor other than air-density fluctuation, such as vibration and/or motion of the projection lens 12. In other words, after accounting for changes to the reference beam(s) due to air-density fluctuation, any residual changes to the reference beam(s) are presumed due to motion of the projection lens or other vibration.

The effects of air-density fluctuations and mechanical vibrations can be further separated by examining the frequency spectrum of fluctuations exhibited by the interferometers. The frequency spectrum of air-density fluctuations peaks at low frequencies and falls off rapidly at higher frequencies. Typically, air-density fluctuations are significant only below frequencies of about 10 Hz. Thus, frequency filtering of the interferometer signal can help to separate the two contributions. However, vibrations having frequencies below about 10 Hz are more difficult to separate and require additional measures, as described in the '630 provisional application cited above.

Figure 10A:
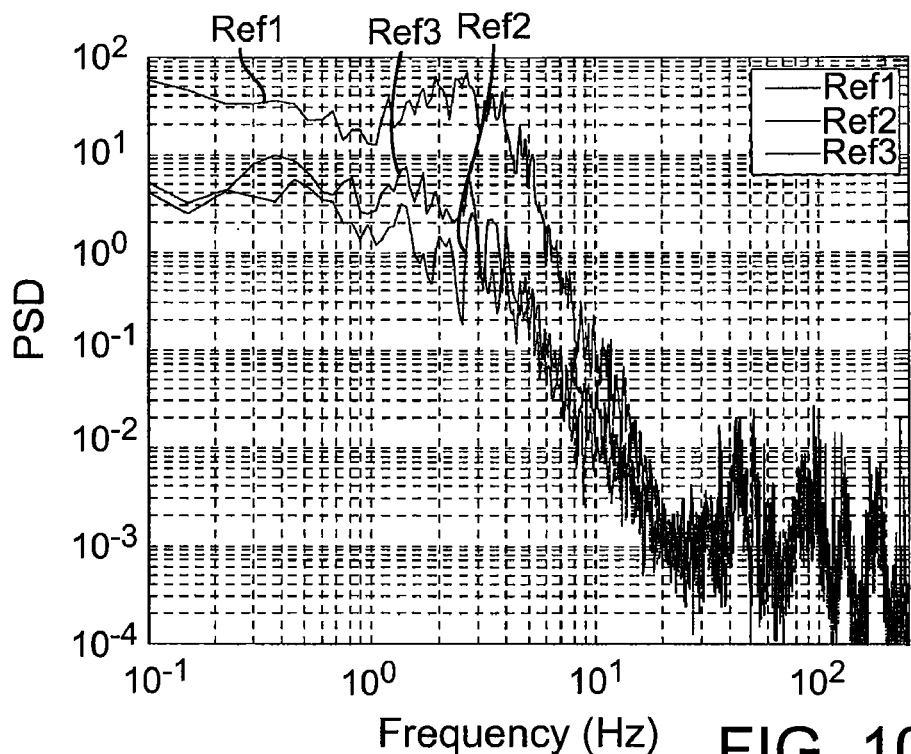
FIG. 10(A) shows the power spectrum for three interferometer beams of fixed length.
Figure 10B:
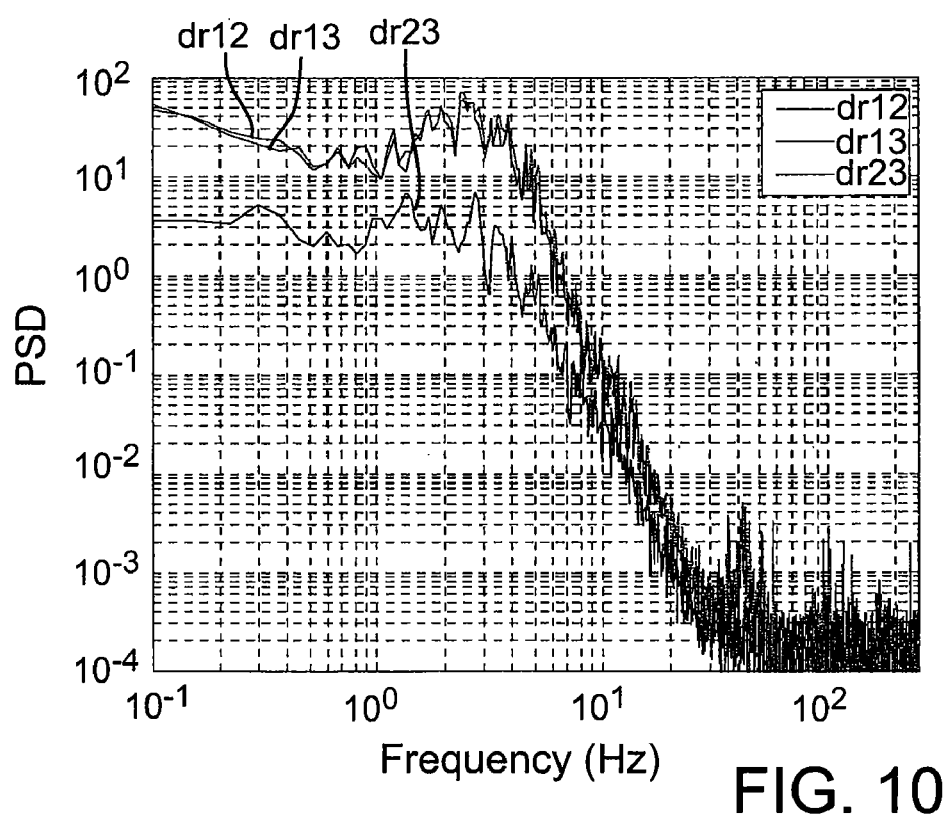
FIG. 10(B) shows the power spectrum for the differences between the three interferometer beams that are the subject of FIG. 10(A).

These comments are illustrated in FIGS. 10(A) and 10(B). FIG. 10(A) shows the power spectrum of fluctuations from three interferometer reference beams of nominally fixed length. The spectra below approximately 20 Hz may be associated with air fluctuations, having the characteristic shape associated with spectra of turbulence. The peaks and extended structure above about 20 Hz are associated with mechanical noise of the system. A low-pass filter can remove essentially all of the high-frequency noise without affecting the air-fluctuation signal. However, applying a filtering operation introduces a time delay which may affect real-time operation.

FIG. 10(B) shows the power spectra for signals representing the difference of two of the three interferometer signals. For example, the quantity dr12 is defined as $$dr12=Ref1-Ref2, \qquad (4)$$

etc. We see that simply taking the difference of two interferometer signals can substantially eliminate the effects of mechanical noise, as asserted above.

Figure 3B:
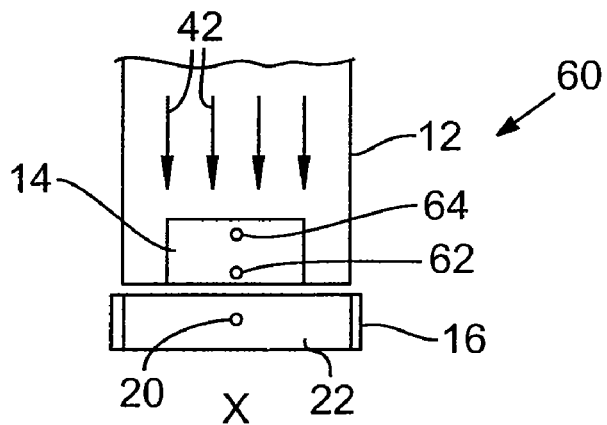
Figure 3C:
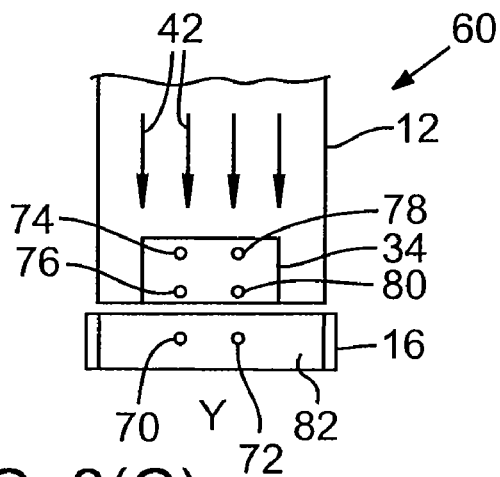

An example embodiment 60 is shown in FIGS. 3(A)-3(C), which is configured for measuring yaw of the projection lens 12 while any pitch and roll of the projection lens 12 are regarded as negligible. Three interferometer beams 20, 62, 64 (from interferometers 18, 66, 68, respectively) are provided in the x-direction, of which two beams 62, 64 are reference beams directed to the mirror 14 on the projection lens 12, and one beam 20 is a measurement beam directed to the mirror 22 on the stage 16. The reference beams 62, 64 are redundant. Use of multiple reference beams 62, 64 in the x-direction allows air-density fluctuations occurring in the x-direction propagation pathway to be separated from movements of the projection lens 12. This separation is made possible by predicting the propagation of fluctuations, in the direction of air flow 42 (as described in the '630 application cited above), from beam to beam, and regarding any change in the reference beam not attributable to air-density fluctuations as due to movements of the projection lens 12. A similar arrangement is made in the y-direction, which utilizes six interferometer beams 70, 72, 74, 76, 78, 80 (FIG. 3(C)). Four of the y-direction beams 74, 76, 78, 80 are reference beams directed to the mirror 34 on the projection lens 12, and the other two beams 70, 72 are measurement beams directed to a mirror 82 on the stage 16. Of each pair of reference beams 74, 76 and 78, 80, one beam is redundant to the other beam. Use of multiple reference beams 74, 76, 78, 80 allows air-density fluctuations and projection-lens motions to be separated from each other and hence reliably accounted for in stage-position measurements in the x- and y-directions.

Figure 4:
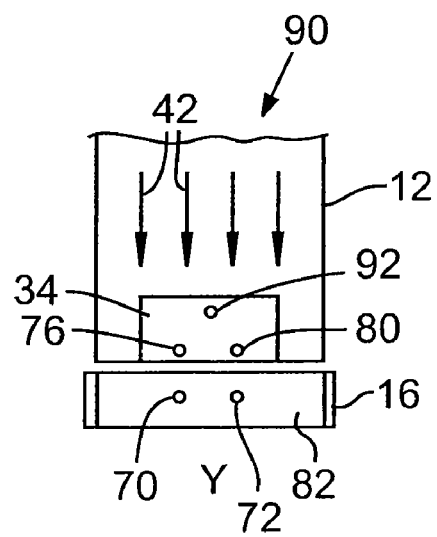
FIG. 4 is an elevational view of a fourth representative embodiment.

If the air down-flow 42 for the y-direction interferometer beams 70, 72, 74, 76, 78, 80 is relatively uniform in the x-direction, it may be possible to produce the desired correction using a single y-direction "second" (or redundant) reference beam 92, as shown in the embodiment 90 depicted in FIG. 4.

As demonstrated in FIG. 10(A), high-frequency mechanical vibrations can be successfully separated from the air fluctuations in the reference interferometer signals. However lower-frequency mechanical motion, below about 10 to 20 Hz, is difficult to remove. Such motion can arise from vibration-isolation subsystems that isolate, for example, the lens system from ground or stage vibrations. This motion can be removed by measuring relative motions of the lens and stage or body subsystems using auxiliary measurement sensors. In addition, system models, such as a Kalman filter can also assist in removing the contributions by mechanical motion. This can be effective because such system models only need to model accurately low-frequency motion, where modal excitations are absent and subsystems can be modeled as rigid bodies.

Referring again to FIGS. 3(A)-3(B), providing a second (redundant) reference beam for each first reference beam yields improved prediction of air-density fluctuations in the interferometer beam-propagation pathways. Two reference beams can provide information on "real-time" errors caused by air-density fluctuations without knowing the down-flow properties such as air velocity. This is because, if the air-flow properties change, corresponding changes occur in an adaptive filter used for making the predictions, described in the U.S. Provisional application No. 60/856,630, cited above. The predictions are based on optical path length fluctuation, previously occurring in the corresponding reference beams, that propagate to the measurement beam by the air flow 42 that passes from the reference beams to the measurement beam.

The embodiments described above can be used on either or both the reticle stage and substrate stage in a projection-lithography system. They can also be used in any of various embodiments of stage-stage movement synchronization, as described below.

Stage-Stage Movement Synchronization

Figure 5A:
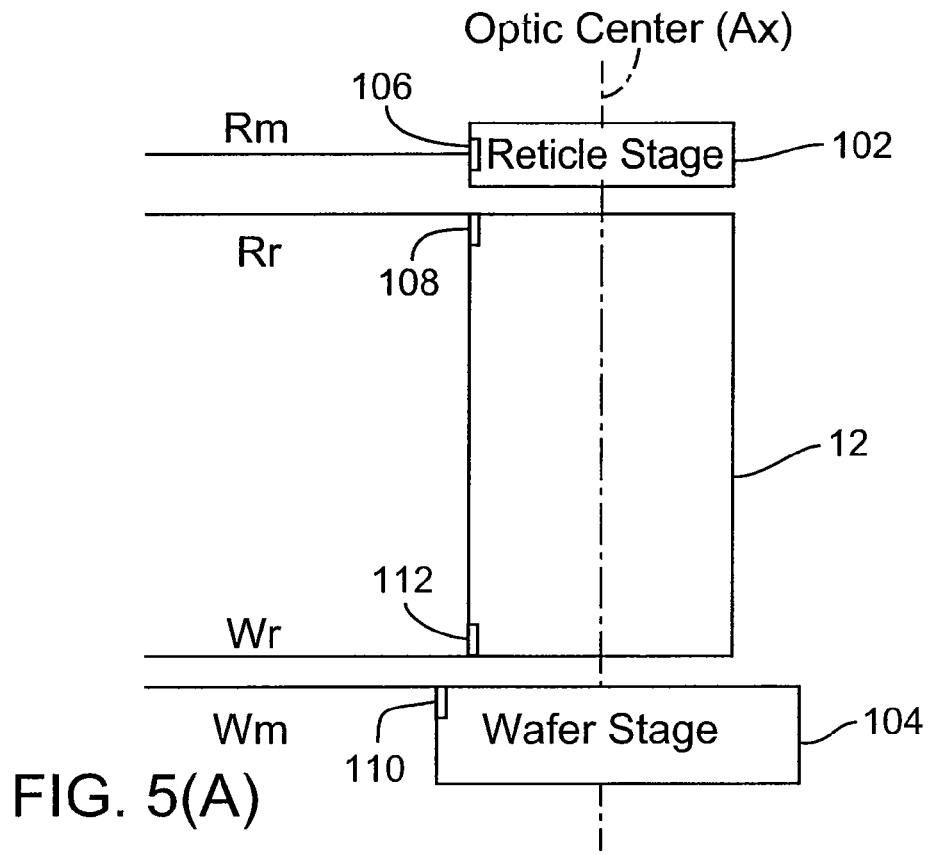
FIG. 5(A) is an elevational schematic diagram illustrating components and relationships used in several embodiments in which motions of the reticle stage and wafer stage are synchronized.
Figure 5B:
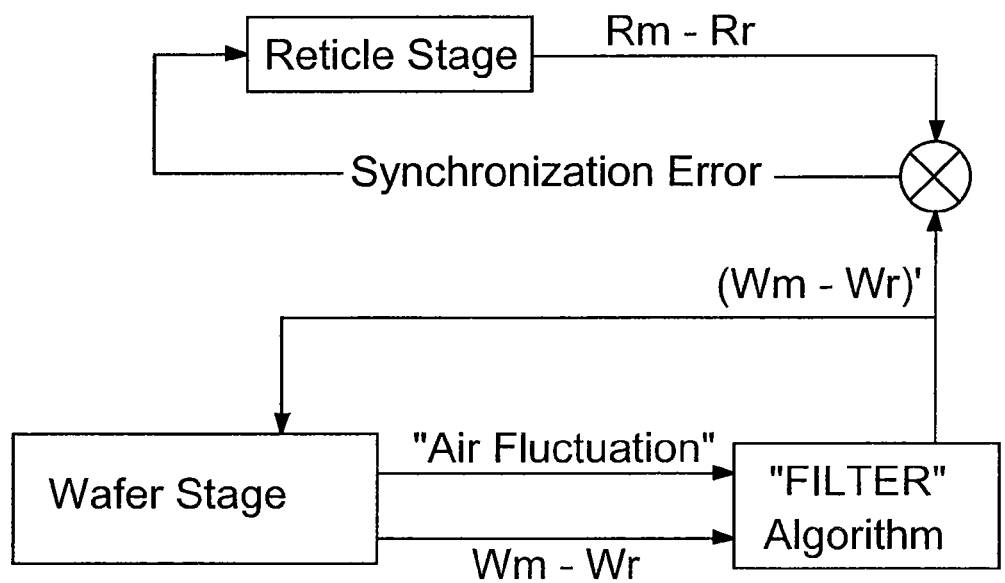
FIG. 5(B) is a control diagram of stage-stage synchronization according to a first embodiment.

One embodiment of a synchronization scheme is shown as FIGS. 5(A)-5(B). FIG. 5(A) depicts a projection lens 12, a reticle stage 102, and a wafer (substrate) stage 104. The projection lens 12 extends along an optical axis (not shown) that is parallel to a z-axis. A reticle measurement beam $R_m$ impinges on a mirror 106 on the reticle stage 102, and a corresponding reticle reference "beam" $R_r$ impinges on a mirror 108 on the projection lens 12 at a location near the reticle measurement beam $R_m$. The beams $R_m$, $R_r$ are parallel to each other and separated from each other by a known distance. Similarly, a wafer measurement beam $W_m$ impinges on a mirror 110 on the wafer stage 104, and a corresponding wafer reference "beam" $W_r$ impinges on a mirror 112 on the projection lens 12 at a location near the wafer measurement beam $W_m$. The beams $W_m$, $W_r$ are parallel to each other and separated from each other by a known distance. The reticle stage 102 and wafer stage 104 are movable relative to the projection lens 12 and thus movable relative to the optical axis Ax. Movements of the reticle stage 102 and wafer stage 104 are detected by the interferometers $R_m$, $W_m$, respectively, relative to interferometer readings obtained by the reference beams $R_r$, $W_r$.

Although the reticle measurement beam $R_m$ and reticle reference beam $R_r$ are denoted as respective single beams in FIG. 5(A), the reticle reference "beam" $R_r$ can comprise multiple beams (two or more beams, wherein at least one is redundant) capable of separating out motions of the projection lens 12 from variations due to air-density fluctuations and variations due to lens motions. Similarly, although the wafer measurement beam $W_m$ and wafer reference beam $W_r$ are denoted as respective single beams in FIG. 5(A), at least the wafer reference "beam" $W_r$ can comprise multiple beams (two or more beams, wherein at least one is redundant) capable of separating out motions of the projection lens from variations due to air-density fluctuations and variations due to lens motion. Thus, $R_r$ and $W_r$ are respective reference "beams" for respective interferometer blocks for the reticle stage 102 and wafer stage 104, and can be used to establish an actual optical center (exposure center) for each stage. Even though FIG. 5(A) shows interferometer beams propagating in one direction (x-direction), a similar set of beams $R_m$, $R_r$, $W_r$, $W_m$ can be provided for measuring motions in the other direction (y-direction) of stage movements if the stage is movable in the other direction. Similarly, $R_m$ and $W_m$ may represent multiple beams.

According to the above, multiple reference beams are advantageously used for determining instability of the projection lens if such instability is not or cannot be checked by another method. Hence, multiple reference beams are not required, especially if projection-lens motions can be determined by a method other than interferometry, as noted earlier herein.

Turning now to FIG. 5(B), the blocks denoted "Reticle Stage" 102 and "Wafer Stage" 104 include respective controllers that control movements of these stages and also include respective reference and measurement interferometers. The difference ($W_m$-$W_r$) is determined from data from at least one wafer-stage measurement interferometer ($W_m$) and multiple (including a redundant) wafer-stage reference interferometers ($W_r$) having beams propagating in the x-direction. The difference ($R_m$-$R_r$) is determined from data from a reticle-stage measurement interferometer ($R_m$) and the reticle-stage reference interferometers ($R_r$).

The wafer-stage controller (in the block 104) receives signals from the wafer-stage interferometers and determines the difference ($W_m$-$W_r$) as well as "Air Fluctuation" detected by these interferometers. "Air Fluctuation" comprises fluctuations in $W_m$ that are predicted from corresponding measured fluctuations in the beam of a first reference interferometer $W_r$. Remaining fluctuations are attributable to motions of the projection lens 12 as determined with the aid of multiple redundant reference interferometers. Hence, the wafer stage 104 includes at least two reference interferometers with beams in the x-direction. The difference ($W_m$-$W_r$) constitutes data, obtained during actual movements of the wafer stage 104, that are independent of movements of the projection lens 12. Both quantities, ($W_m$-$W_r$) and Air Fluctuation, are input to a filter 114 that determines, from these inputs and according to an algorithm, a "true" wafer-stage position ($W_m$-$W_r$)' that takes into account fluctuations in the interferometer beam paths and movements of the projection lens 12. To such end, the algorithm programmed into the filter 114 self-adjusts its transfer function, based at least on the Air Fluctuation data. The reticle-stage controller (in the block 102) receives signals from the reticle-stage interferometers and determines the difference $R_m$-$R_r$.

The true wafer-stage position ($W_m$-$W_r$)' is compared to the difference ($R_m$-$R_r$) to yield a "Synchronization Error" that represents a positional discrepancy in the positions of the stages. The synchronization error is input to the reticle-stage controller that adjusts the reticle-stage position accordingly. Meanwhile the difference ($R_m$-$R_r$) continues to be determined and compared with ($W_m$-$W_r$)', with the position of the reticle stage adjusted accordingly until the synchronization error is nil (or reaches a predetermined value).

Since fluctuations due to air flow and movement of the projection lens 12 vary with time, the filter 114 desirably is capable of responding to these time-varying parameters. An example filter 114 is a linear adaptive filter such as a QR decomposition-recursive least squares (QRD-RLS) filter. This type of filter can analyze a time series of data, detect trends of such data, and make predictions based on the trends. Changes are made automatically to the transfer function of the filter, based on the success of the predictions. Desirably, inputs to the filter 114 are low-pass filtered to isolate air fluctuations, which are typically low-frequency, from vibrations related to stage motion.

Another embodiment is shown in FIG. 5(C), depicting the wafer stage 104 and reticle stage 102. The interferometers of the reticle stage 102 produce the difference ($R_m$-$R_r$). The interferometers of the wafer stage 104 produce the difference ($W_m$-$W_r$) as well as "Air Fluctuation" data. An uncompensated synchronization error is produced from the differences ($W_m$-$W_r$) and ($R_m$-$R_r$). The adaptive filter 124 executes its filter algorithm based on the "air fluctuation" and uncompensated synchronization error inputs. Thus, the filter 124 produces a compensated synchronization error that takes into account air fluctuation and projection-lens movement and that is fed directly into the reticle-stage controller 102. If the air-density fluctuation (less lens movement) can be detected by the $W_r$ interferometers in a "real-time" manner, then the filter algorithm in the filter 124 can combine it with the uncompensated synchronization error. The result of the filter algorithm is a "true" error fed back to the reticle-stage controller 102 for synchronization with the wafer stage 104.

Based on the above, one or more of the following are realized: (a) use of information from a process-tool reference interferometer beam to estimate air-fluctuation corrections to be applied to data from the measurement beam of a stage-position interferometer; (b) use a corrected stage interferometer signal to correct first-stage-second-stage synchronization errors by applying correction to either the first stage or the second stage; and (c) use of a processor to separate motion of a process tool from air fluctuations in reference interferometer beam signals.

Microlithography System

Figure 7A:
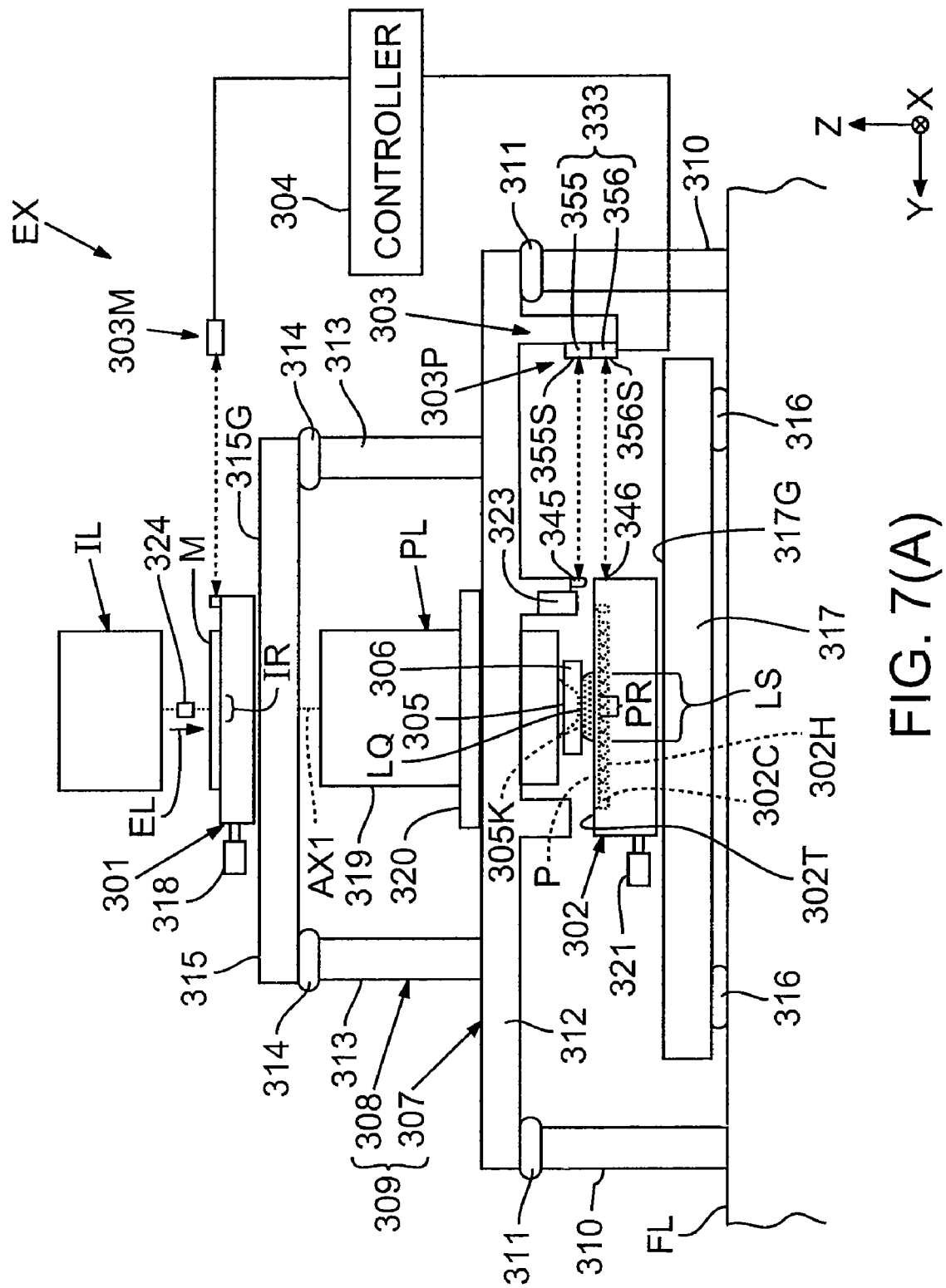
FIG. 7(A) is an elevational schematic diagram showing certain aspects of an exemplary exposure system that includes at least one of the embodiments disclosed herein.
Figure 7B:
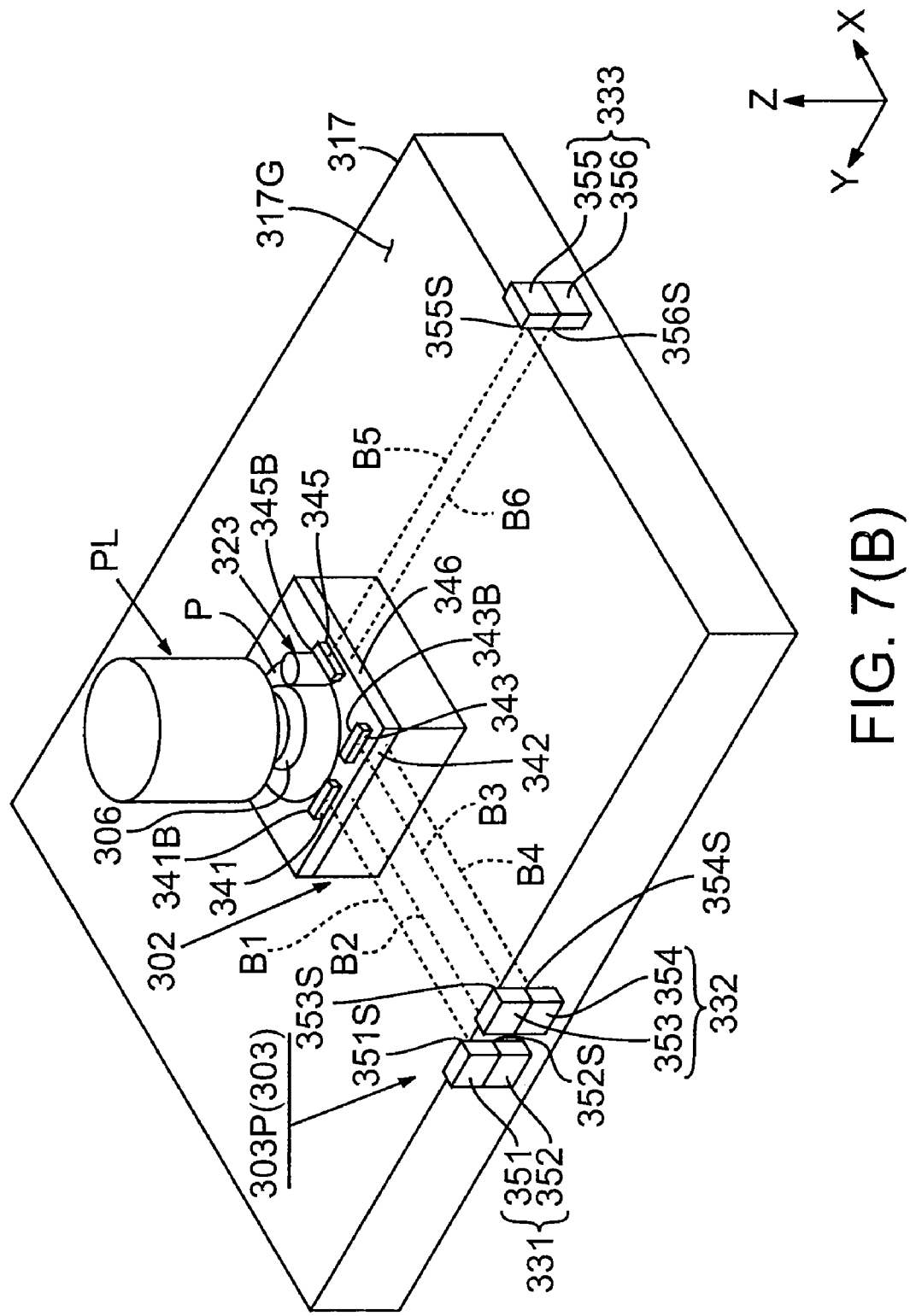
FIG. 7(B) is an isometric view of the surface 17, the substrate stage 2, and the projection-optical system of the exposure system of FIG. 7(A).
Figure 7C:
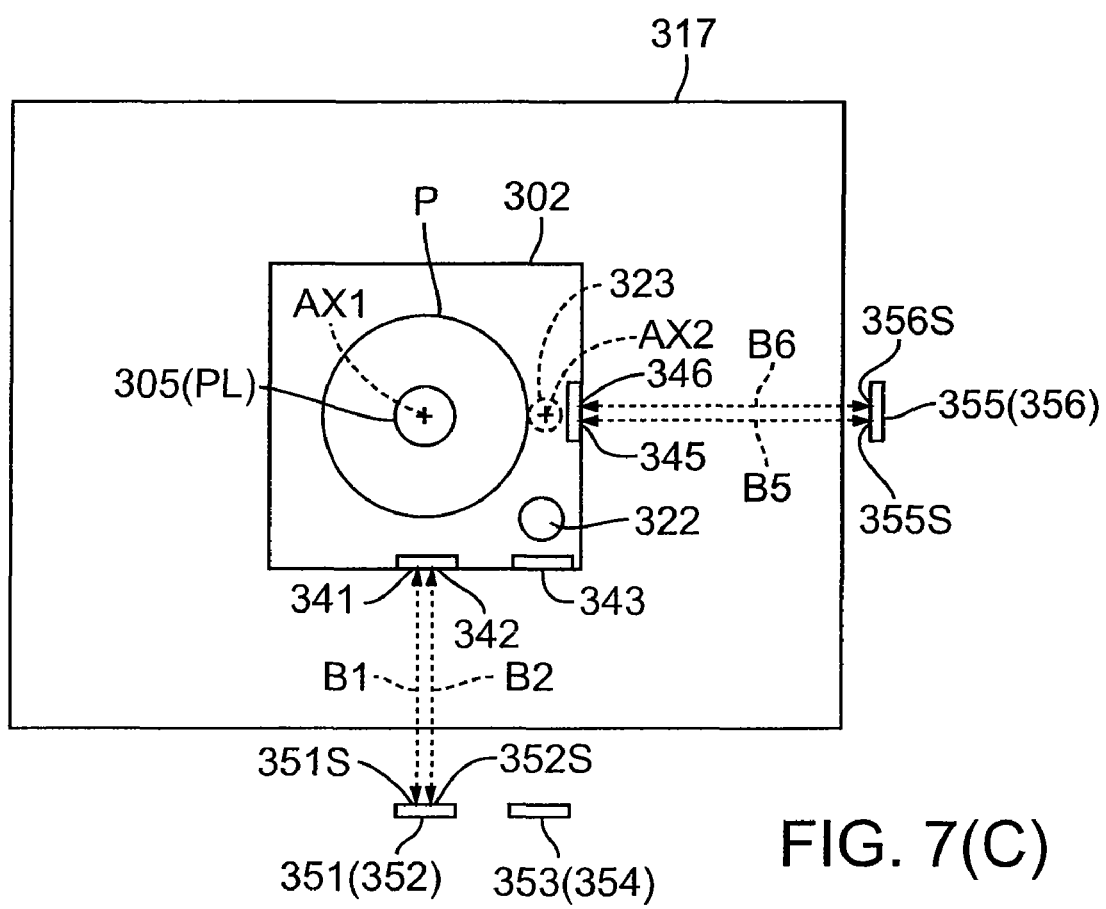
FIG. 7(C) is a plan view of FIG. 7(C).

FIGS. 7(A)-7(C) schematically depict an exemplary embodiment of an exposure system EX comprising features as described above. In FIG. 7(A), the exposure system EX comprises a mask stage 301 movable while holding a patterned mask M, a substrate stage 302 movable while holding a substrate P, a first driving system 318 that controllably moves the mask stage 301, a second driving system 321 that controllably moves the substrate stage 302, a measurement system 303 that includes laser interferometers for measuring the position information of the mask stage 301 and substrate stage 302, an illumination-optical system IL that illuminates the mask M with an energy beam EL, a projection-optical system PL that projects the image of the pattern on the mask M illuminated by the energy beam EL onto the substrate P, and a controller 304 that controls the operation of the entire exposure system EX.

The substrate P referred to herein is a substrate used for fabricating devices. The substrate P includes a substrate such as a semiconductor wafer, e.g., a silicon wafer, on which a photosensitive film has been formed. A photosensitive film is a film of photosensitive material (photoresist). Alternatively, the substrate P may have different types of films formed thereon such as a protective film (top coat film) aside from a photosensitive film. The mask M includes a reticle on which a device pattern to be projected onto the substrate P has been formed. An example of such mask is a transparent plate member, such as a glass plate, on which a given pattern has been formed using a light shielding film such as chrome. This transmissive mask is not limited to a binary mask onto which a pattern is formed with a light shielding film, but also includes a phase-shift mask such as a half-tone phase shift mask or a spatial frequency-modulated phase shift mask. Alternatively, a reflective mask can also be used, although a transmissive mask is used as the mask M in the present embodiment.

In the present embodiment, descriptions will be given using an example where the exposure system EX is an immersion exposure system that exposes the substrate P with an energy beam EL through a liquid LQ. In this embodiment, a liquid immersion space LS is formed such that the liquid LQ fills the space of the optical path of the energy beam EL on the image plane side of an endmost optical element 305, closest to the image plane of the projection-optical system PL among a plurality of optical elements of the projection-optical system PL. The space of the optical path of the energy beam EL is a space that includes the optical path through which the energy beam EL passes. The liquid immersion space LS is a space filled with the liquid LQ. In this embodiment, water (purified water) is used as the liquid LQ.

The exposure system EX comprises a liquid immersion member 306 used for forming the liquid space LS. The liquid immersion member 306 is located near the endmost optical element 305. The liquid immersion member 306 can be as disclosed in International Published Patent Application No. 2006/106907, for example. The liquid immersion space LS is formed between the endmost optical element 305 and the liquid immersion member 306, and the object arranged in a position facing the endmost optical element 305 and the liquid immersion member 306. In this embodiment, objects that can be placed in the position facing the endmost optical element 305 and the liquid immersion member 306 include the substrate stage 302 and the substrate P held by the substrate stage 302.

In this embodiment, the exposure system EX adopts a local liquid immersion method in which the liquid immersion space LS is formed such that a region on the substrate P that includes a projection region PR of the projection-optical system PL is partially covered by the liquid LQ.

The exposure system EX in this embodiment is a scanning exposure system (what is called scanning stepper) that projects the image of the pattern on the mask M onto the substrate P, while moving the mask M and the substrate P in a given scan direction in synchronization. When the substrate P is exposed, the mask M and the substrate P are moved in a given scan direction in the XY plane that intersects with an optical axis AX1 (optical path of the energy beam EL), of the projection-optical system PL, which is nearly parallel to the Z axis. In this embodiment, the scan direction (direction of the synchronous motion) of the substrate P is the Y-axis direction, and the scan direction (direction of the synchronous motion) of the mask M is also the Y-axis direction. The exposure system EX irradiates the energy beam EL onto the substrate P through the projection-optical system PL and the liquid LQ in the liquid immersion space LS over the substrate P, while moving the substrate P in the Y-axis direction relative to the projection region PR of the projection-optical system PL, and while moving the mask M in the Y-axis direction relative to an illumination region IR of the illumination-optical system IL in synchrony with the motion of the substrate P in the Y-axis direction. Thus, the image of the pattern on the mask M is projected onto the substrate P, and the substrate P is exposed with the energy beam EL.

The exposure system EX comprises a body 309 that includes a first column 307 provided on a floor FL and a second column 308 provided on the first column 307. The first column 307 comprises a plurality of first pillars 310 provided on the floor FL and a first surface plate 312 supported by the first pillars 310 via first anti-vibration devices 311. The second column 308 comprises a plurality of second pillars 313 provided on the first surface plate 312 and a second surface plate 315 supported by the second pillars 313 via second anti-vibration devices 314. The exposure system EX also comprises a third surface plate 317 supported by the floor FL via third anti-vibration devices 316. Each of the first anti-vibration devices 311, second anti-vibration devices 314, and third anti-vibration devices 316 includes an active anti-vibration device comprising given actuators and damper mechanism.

The illumination-optical system IL illuminates the given illumination region IR on the mask M with the energy beam EL having a uniform illumination intensity distribution. As the energy beam EL emitted from the illumination-optical system IL, emission lines (g-line, h-line, i-line) emitted from a mercury lamp, deep ultraviolet lights (DUV light) such as a KrF excimer laser light (with a wavelength of 248 nm), vacuum ultraviolet light such as an ArF excimer laser light (with a wavelength of 193 nm) and an $F_2$ laser light (with a wavelength of 157 nm) can be used, for example. In this embodiment, an ArF excimer laser light, which is an ultraviolet light (vacuum-ultraviolet light), is used as the energy beam EL.

The mask stage 301 is made movable by the first driving system 318 that includes an actuator such as a linear motor while holding the mask M. The mask stage 301 moves on the second surface plate 315. The second surface plate 315 has a guide surface 315G that movably supports the mask stage 301. The guide surface 315G is nearly parallel to the XY plane. The mask stage 301 is movable in the XY plane that includes the location where the energy beam EL from the illumination-optical system IL is irradiated. In this embodiment, the location where the energy beam EL from the illumination-optical system IL is irradiated includes the location that intersects with the optical axis AX1 of the projection-optical system PL. Furthermore, the mask M held by the mask stage 301 is also movable in the XY plane that includes the location where the energy beam EL from the illumination-optical system IL is irradiated. In this embodiment, the mask stage 301 is movable in the X-axis, Y-axis, and $\theta_Z$ directions.

The projection-optical system PL projects the image of the pattern on the mask M onto the substrate P at a certain projection magnification. A plurality of optical elements of the projection-optical system PL is held in a barrel 319. The barrel 319 has a flange 320, and the projection-optical system PL is supported by the first surface plate 312 via the flange 320. An anti-vibration device can be arranged between the first surface plate 312 and the flange 320 (barrel 319).

The projection-optical system PL in this embodiment is a reduction system with a projection magnification such as ¼, ⅕, or ⅛. The projection-optical system PL can also be either a 1× system or a magnification system. In this embodiment, the optical axis AX1 of the projection-optical system PL is parallel to the Z axis. Furthermore, the projection-optical system PL can be any of a dioptric system that does not include catoptrical elements, a catoptrical system that does not include dioptric elements, or a catadioptric system that includes dioptric elements and catoptrical elements. In addition, the projection-optical system PL may form either an inverted image or an erected image.

The substrate stage 302 is made movable by the second driving system 321, that includes an actuator such as a linear motor, while holding the substrate P. The substrate stage 302 moves on the third surface plate 317. The third surface plate 317 has a guide surface 173G that movably supports substrate stage 302. The guide surface 317G is nearly parallel to the XY plane. The substrate stage 302 is movable in the XY plane that includes the location where the energy beam EL from the endmost optical element 305 (projection-optical system PL) is irradiated. In this embodiment, the location where the energy beam EL from the endmost optical element 305 is irradiated includes the location facing an exit plane 305K of the endmost optical element 305 and the location that intersects with the optical axis of the endmost optical element 305 (optical axis AX1 of the projection-optical system PL). In addition, the substrate P held by the substrate stage 302 is also movable in the XY plane that includes the location where the energy beam EL from the endmost optical element 305 (projection-optical system PL) is irradiated. In this embodiment, the substrate stage 302 is movable in six directions: X axis, Y axis, Z axis, θx, θy, and θz.

The substrate stage 302 has a substrate chuck 302H that holds the substrate P, and has an upper surface 302T arranged around the substrate chuck 302H. The upper surface 302T of the substrate stage 302 is a flat surface that is nearly parallel to the XY plane. The substrate chuck 302H is located in a concave area 302C arranged on the substrate stage 302. The substrate chuck 2H holds the substrate P such that the surface of the substrate P is nearly parallel to the XY plane. The surface of the substrate P held by the substrate chuck 302H and the upper surface 302T of the substrate stage 302 are placed in nearly the same plane and thus are nearly coplanar.

Further with respect to FIG. 7(A), the exposure system EX in this embodiment comprises a first detection device 323 for acquiring position information of the shot region on the substrate P. The first detection device 323 includes an off-axis-type alignment system arranged near the projection-optical system PL. At least some part of the first detection device 323 is located near the projection-optical system PL. The first detection device 323 is able to detect alignment marks AM on the substrate P and first fiducial marks FM1 placed on the substrate stage 302 (reference plate 322; see FIG. 7(C)). The first detection device 323 in this embodiment adopts the FIA (Field Image Alignment) method, such as the one disclosed in the Japan Laid-Open Patent Application No. 4-65603 (corresponding to U.S. Pat. No. 5,493,403), where a broadband detection light flux that does not expose the photosensitive material on the substrate P is irradiated on target marks (such as the alignment marks AM formed on the substrate P and the first fiducial marks FM1). An image of the target mark imaged on the light-receiving surface by the reflected light from the target mark and an index (index mark placed on an index plate placed inside the first detection device 323) is taken using an imaging device (such as a CCD). The imaging signals are image-processed to measure the position of the marks.

In this embodiment, the first detection device 323 is located adjacent to the −Y side of the projection-optical system PL (endmost optical element 305). In this embodiment, the first detection device 323 is supported by the first surface plate 312.

The exposure system EX in this embodiment also comprises a second detection device 324 for acquiring position information of the image of the pattern on the mask M projected onto the image-plane side of the projection-optical system PL. The second detection device 324 includes a TTR (Through The Reticle) alignment system that uses a light having the wavelength of the exposure beam. At least some part of second detection device 324 is located near the mask stage 301. The second detection device 324 is able to observe simultaneously a pair of alignment marks on the mask M and a conjugate image through the projection-optical system PL of second fiducial marks FM2 placed on the substrate stage 302 (reference plate 322; see FIG. 7(C)) corresponding to the alignment marks. The second detection device 324 in this embodiment adopts the VRA (Visual Reticle Alignment) method, such as the one disclosed in Japan Laid-Open Patent Application No. 7-176468 (corresponding to U.S. Pat. No. 6,498,352), in which a light is irradiated on a mark, and image data of the mark imaged by an imaging device such as a CCD camera are image-processed to detect the position of the mark.

FIG. 7(B) is a schematic isometric view of an interferometer system 303P for the substrate stage. The interferometer system 303P for the substrate stage has a first interferometer system 331, a second interferometer system 332, and a third interferometer system 333. The first interferometer system 331 is arranged on the −X side relative to the projection-optical system PL. The second interferometer system 332 is arranged on the −X side relative to the first detection device 323. The third interferometer system 333 is arranged on the −Y side relative to the first detection device 323. The first detection device 323 is arranged on the −Y side of the projection-optical system PL.

The first interferometer system 331 comprises a first interferometer 351 having a first beam-exit part 351S from which a first beam B1 is emitted and a second interferometer 352 having a second beam-exit part 352S from which a second beam B2 is emitted. The first and second interferometers 351 and 352 are laser interferometers, and the first and second beams B1 and B2 are laser beams. The first interferometer 351 obtains interferometric information based on the first beam B1 by irradiating the first beam B1 onto a first reflective surface 341 and receiving the reflected light of the first beam B1 irradiated on first reflective surface 341. The second interferometer 352 obtains interferometric information based on the second beam B2 by irradiating the second beam B2 onto a second reflective surface 342 and receiving the reflected light of the second beam irradiated on second reflective surface 42.

The first reflective surface 341 is a surface perpendicular to the X axis. That is, the first reflective surface 341 is a surface parallel to the YZ plane. For the first interferometer 351, the X axis is the measurement axis. The first beam B1 from the first interferometer 351 travels in the X-axis direction and is incident on the first reflective surface 341. The first interferometer 351 receives the first beam B1 reflected from the first reflective surface 341 and measures the position information of the first reflective surface 341 with respect to the X-axis direction.

The second reflective surface 342 is a surface perpendicular to the X axis. That is, the second reflective surface 342 is a surface parallel to the YZ plane. For the second interferometer 352, the X axis is the measurement axis. The second beam B2 from the second interferometer 352 travels in the X-axis direction and is incident on the second reflective surface 342. The second interferometer 352 receives the second beam B2 reflected from the second reflective surface 342 and measures the position information of the second reflective surface 342 with respect to the X-axis direction.

The first reflective surface 341 is arranged such that it is nearly stationary. In this embodiment, the first reflective surface 341 is arranged on a fixed member 341B that is fixed such that it is nearly stationary. The second reflective surface 342 is arranged on the substrate stage 302. The first interferometer system 331 measures the position information of the substrate stage 302 with respect to the X-axis direction based on the measurement results of the first interferometer 351 and the measurement results of the second interferometer 352.

The second interferometer system 332 comprises a third interferometer 353 having a third beam-exit part 353S from which a third beam B3 is emitted and a fourth interferometer 354 having a fourth beam-exit part 354S from which a fourth beam B4 is emitted. The third and fourth interferometers 353 and 354 are laser interferometers, and the third and fourth beams B3 and B4 are laser beams. The third interferometer 353 obtains interferometric information based on the third beam B3 by irradiating the third beam B3 onto a third reflective surface 343 and receiving the reflected light of the third beam B3 irradiated on the third reflective surface 343. The fourth interferometer 354 obtains interferometric information based on the fourth beam B4 by irradiating the fourth beam B4 onto the second reflective surface 342 and receiving the reflected light of the fourth beam B4 irradiated on the second reflective surface 342.

The third reflective surface 343 is a surface perpendicular to the X axis. That is, the third reflective surface 343 is a surface parallel to the YZ plane. For the third interferometer 353, the X axis is the measurement axis. The third beam B3 from the third interferometer 353 travels in the X-axis direction and enters into the third reflective surface 343. The third interferometer 353 receives the light of the third beam B3 reflected from the third reflective surface 343 and measures the position information of the third reflective surface 343 with respect to the X-axis direction.

For the fourth interferometer 354, the X axis is the measurement axis. The fourth beam B4 from the fourth interferometer 354 travels in the X-axis direction and is incident on the second reflective surface 342. The fourth interferometer 354 receives the light of the fourth beam B4 reflected from the second reflective surface 342 and measures the position information of the second reflective surface 342 with respect to the X-axis direction.

The third reflective surface 343 is arranged such that it is nearly stationary. In this embodiment, the third reflective surface 343 is arranged on a fixed member 343B that is fixed such that it is nearly stationary. The second interferometer system 332 measures the position information of the substrate stage 302 with respect to the X-axis direction based on the measurement results of the third interferometer 353 and the measurement results of the fourth interferometer 354.

The third interferometer system 333 comprises a fifth interferometer 355 having a fifth beam-exit part 355S, from which a fifth beam B5 is emitted, and a sixth interferometer 356 having a sixth beam-exit part 356S from which a sixth beam B6 is emitted. The fifth and sixth interferometers 355 and 356 are laser interferometers, and the fifth and sixth beams B5 and B6 are laser beams. The fifth interferometer 355 obtains interferometric information based on the fifth beam B5 by irradiating the fifth beam B5 onto a fifth reflective surface 345 and receiving the reflected light of the fifth beam B5 irradiated on the fifth reflective surface 345. The sixth interferometer 356 obtains interferometric information based on the sixth beam B6 by irradiating the sixth beam B6 onto a sixth reflective surface 346 and receiving the reflected light of the sixth beam B6 irradiated on sixth reflective surface 346.

The fifth reflective surface 345 is a surface perpendicular to the X axis. That is, the fifth reflective surface 345 is a surface parallel to the XZ plane. For the fifth interferometer 355, the Y axis is the measurement axis. The fifth beam B5 from the fifth interferometer 355 travels in the Y-axis direction and is incident on the fifth reflective surface 345. The fifth interferometer 355 receives the light of the fifth beam B5 reflected from the fifth reflective surface 345 and measures the position information of the fifth reflective surface 345 with respect to the Y-axis direction.

The sixth reflective surface 346 is a surface perpendicular to the Y axis. That is, the sixth reflective surface 346 is a surface parallel to the XZ plane. For the sixth interferometer 356, the Y axis is the measurement axis. The sixth beam B6 from the sixth interferometer 356 travels in the Y-axis direction and is incident on the sixth reflective surface 346. The sixth interferometer 356 receives the light of the sixth beam B6 reflected from the sixth reflective surface 346 and measures the position information of the sixth reflective surface 346 with respect to the Y-axis direction.

The fifth reflective surface 345 is arranged such that it is nearly stationary. In this embodiment, the fifth reflective surface 345 is arranged on a fixed member 345B that is fixed such that it is nearly stationary. The sixth reflective surface 346 is arranged on the substrate stage 302. The third interferometer system 333 measures the position information of the substrate stage 302 with respect to the Y-axis direction based on the measurement results of the fifth interferometer 355 and the measurement results of the sixth interferometer 356.

The first beam B1 and second beam B2 from the first interferometer system 331 travel in the X-axis direction towards the optical axis AX1 of the projection-optical system PL. The third beam B3 and the fourth beam B4 from the second interferometer system 332 travel in the X-axis direction toward the optical axis AX2 of first detection device 323. The optical axis AX1 of the projection-optical system PL and the optical axis AX2 of the first detection device 323 are arranged along a given axis parallel to the Y axis. The fifth beam B5 and the sixth beam B6 from the third interferometer system 333 travel in the Y-axis direction toward the optical axis AX1 of the projection-optical system PL and the optical axis AX2 of the first detection device 323.

Furthermore, the fixed member 41B having the first reflective surface 341 is located on the −X side relative to the projection-optical system PL and is fixed onto the first surface plate 312. The first reflective surface 341 is located on the −X side relative to the projection-optical system PL and is facing the −X direction. The fixed member 43B having the third reflective surface 343 is located on the −X side relative to the first detection device 323 and is fixed onto the first surface plate 312. The third reflective surface 343 is located on the −X side relative to the first detection device 323 is facing the −X direction. The fixed member 345B having the fifth reflective surface 345 is located on the −Y side relative to first detection device 323 and is fixed onto the first surface plate 312. The fifth reflective surface 345 is located on the −Y side relative to the first detection device 323 is facing the −Y direction.

The first reflective surface 341 of the fixed member 341B supported by the first surface plate 312 may be placed near the second reflective surface 342. Similarly, the third reflective surface 343 of the fixed member 343B supported by the first surface plate 312 may be placed near the second reflective surface 342. Similarly, the fifth reflective surface 345 of the fixed member 345B supported by the first surface plate 312 may be placed near the sixth reflective surface 346. Furthermore, by mounting the first, third, and fifth reflective surfaces 341, 343, 345 of the fixed members 341B, 343B, 345B, respectively, on the first surface plate 312, effects that the motion of the projection-optical system PL (barrel 319) give to the first, third, and fifth reflective surfaces 341, 343, 345 can be suppressed.

The second reflective surface 342 is located on the −X side relative to the substrate stage 302 and is facing the −X direction. The second reflective surface 342 has an outer shape that is long in the Y−axis direction. The sixth reflective surface 346 is located on the −Y side of the substrate stage 302 and is facing the −Y direction. The sixth reflective surface 346 has an outer shape that is long in the Y-axis direction.

FIG. 7(C) is a plan view from the +Z side. As shown in FIG. 7(C), in this embodiment, when the center position of the substrate P held by the substrate stage 302 is in a position facing the beam-exit plane 305K of the endmost optical element 305 (position where the center position of the substrate P corresponds to the optical axis AX1), the distance between the first beam-exit part 351S of the first interferometer system 331 and the first reflective surface 341, and the distance between the second beam-exit part 352S and the second reflective surface 342 almost coincide.

Meanwhile, the center position of the substrate P is the center position of the surface of the substrate P; that is, the center position of the substrate P in the XY plane.

The first interferometer system 331 measures, by using the first reflective surface 341 and the second reflective surface 342, the position information of the substrate stage 302 with respect to the X-axis direction at least when the center position of the substrate P held by the substrate stage 302 is in a position facing the beam-exit plane 305K of the endmost optical element 305.

Furthermore, as shown in FIG. 7(C), in this embodiment, when the center position of the substrate P held by the substrate stage 302 is in a position facing the beam-exit plane 305K of the endmost optical element 305 (position where the center position of the substrate P corresponds to the optical axis AX1), the distance between the fifth beam-exit part 355S of the third interferometer system 333 and the fifth reflective surface 345, and the distance between the sixth beam-exit part 356S and the sixth reflective surface 346 almost coincide.

The third interferometer system 333 measures, by using the fifth reflective surface 345 and the sixth reflective surface 346, the position information of the substrate stage 302 with respect to the Y-axis direction at least when the center position of the substrate P held by the substrate stage 302 is in a position facing the beam-exit plane 305K of the endmost optical element 305.

The principles set forth in the foregoing disclosure further alternatively can be used with any of various other apparatus, including (but not limited to) other microelectronic-processing apparatus, machine tools, metal-cutting equipment, and inspection apparatus.

Semiconductor-Device Fabrication

Figure 8:
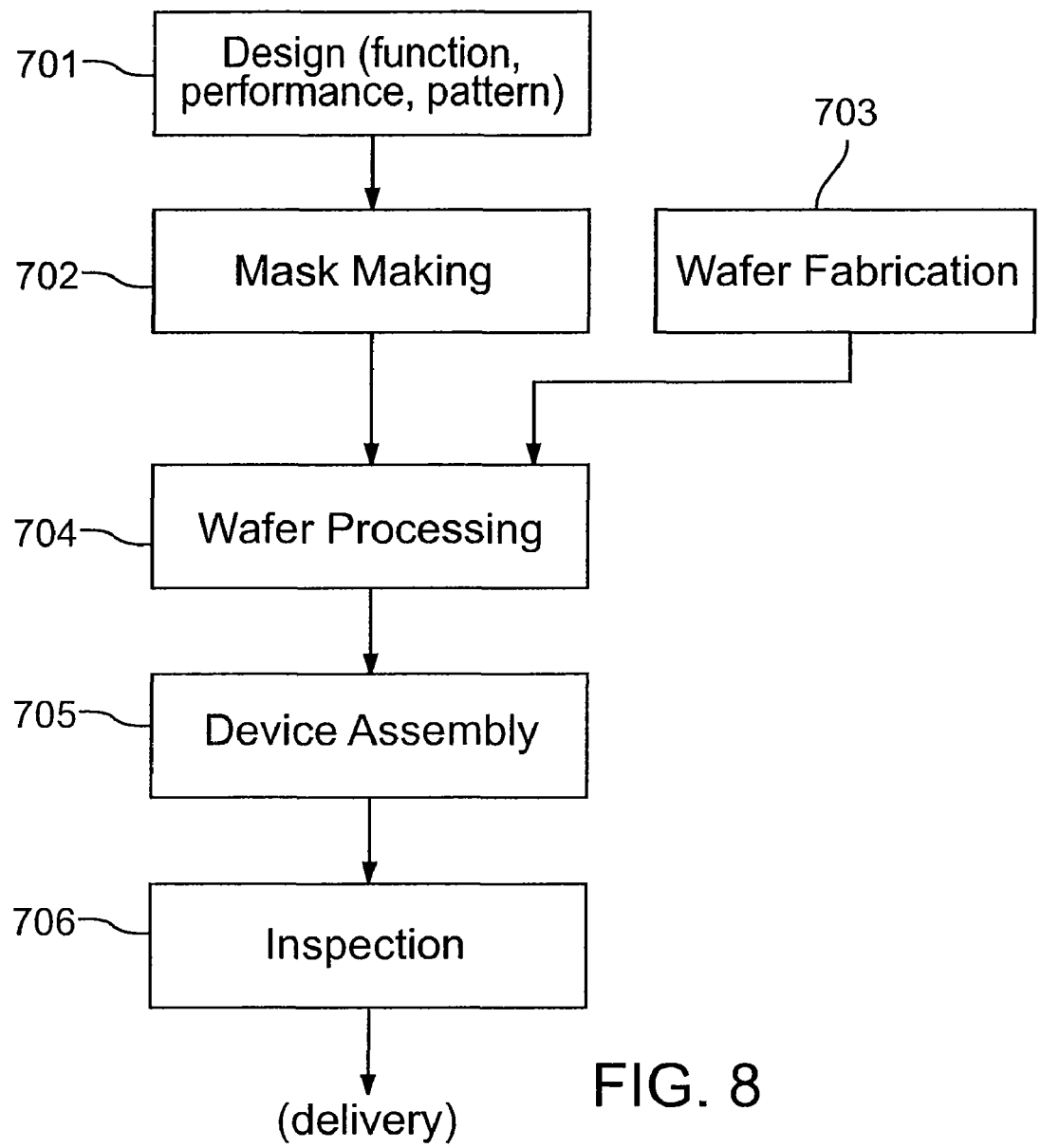
FIG. 8 is a block diagram of an exemplary semiconductor-device fabrication process that includes wafer-processing steps including a lithography step.

Semiconductor devices can be fabricated by processes including microlithography steps performed using a microlithography system as described above. Referring to FIG. 8, in step 701 the function and performance characteristics of the semiconductor device are designed. In step 702 a reticle defining the desired pattern is designed according to the previous design step. Meanwhile, in step 703, a substrate (wafer) is made and coated with a suitable resist. In step 704 the reticle pattern designed in step 702 is exposed onto the surface of the substrate using the microlithography system. In step 705 the semiconductor device is assembled (including "dicing" by which individual devices or "chips" are cut from the wafer, "bonding" by which wires are bonded to the particular locations on the chips, and "packaging" by which the devices are enclosed in appropriate packages for use). In step 706 the assembled devices are tested and inspected.

Figure 9:
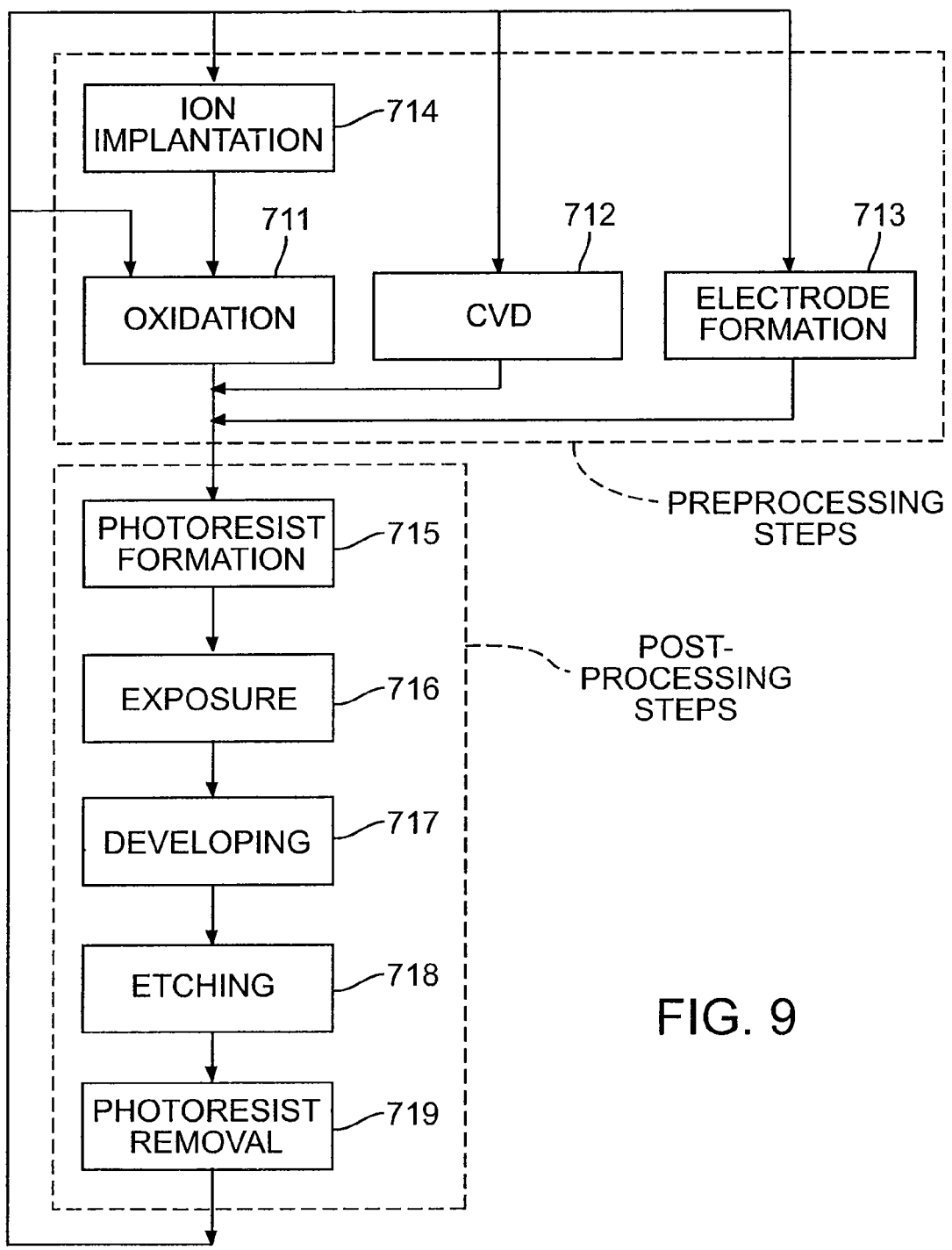
FIG. 9 is a block diagram of a wafer-processing process as referred to in FIG. 8.

Representative details of a wafer-processing process including a microlithography step are shown in FIG. 9. In step 711 (oxidation) the wafer surface is oxidized. In step 712 (CVD) an insulative layer is formed on the wafer surface. In step 713 (electrode formation) electrodes are formed on the wafer surface by vapor deposition for example. In step 714 (ion implantation) ions are implanted in the wafer surface. These steps 711-714 constitute representative "pre-processing" steps for wafers, and selections are made at each step according to processing requirements.

At each stage of wafer processing, when the pre-processing steps have been completed, the following "post-processing" steps are implemented. A first post-process step is step 715 (photoresist formation) in which a suitable resist is applied to the surface of the wafer. Next, in step 716 (exposure), the microlithography system described above is used for lithographically transferring a pattern from the reticle to the resist layer on the wafer. In step 717 (development) the exposed resist on the wafer is developed to form a usable mask pattern, corresponding to the resist pattern, in the resist on the wafer. In step 718 (etching), regions not covered by developed resist (i.e., exposed material surfaces) are etched away to a controlled depth. In step 719 (photoresist removal), residual developed resist is removed ("stripped") from the wafer.

Formation of multiple interconnected layers of circuit patterns on the wafer is achieved by repeating the pre-processing and post-processing steps as required. Generally, a set of pre-processing and post-processing steps are conducted to form each layer.

Whereas the disclosure has been set forth in the context of multiple representative embodiments, it will be understood that the disclosure is not limited to those embodiments. On the contrary, the disclosure is intended to encompass all modifications, alternatives, and equivalents as may be included within the spirit and scope of the invention, as defined by the appended claims.

The invention claimed is:

1. A process apparatus, comprising:
a process tool situated at a process position;
a stage that is movable in at least a first movement direction relative to the process tool;
a first interferometer system situated relative to the stage to determine a position of the stage in the first movement direction relative to the process position, the first interferometer system comprising a respective measurement interferometer system and a respective reference interferometer system producing data regarding stage position in the first movement direction, the respective reference interferometer system comprising a first reference interferometer and a second reference interferometer, the first reference interferometer producing reference data regarding position of the process tool in the movement direction, and the second reference interferometer being redundant to the first reference interferometer;
and
a processor coupled to the first interferometer system and configured to determine, from the data produced by the respective measurement interferometer system and the first reference interferometer, a position of the stage in the first movement direction relative to the process tool, and to determine, from the data produced by the first and second reference interferometers, a displacement of the process tool relative to the process position, and thus to determine a position of the stage in the first movement direction relative to the process position.

2. The apparatus of claim 1, wherein the process tool is an optical system.

3. The apparatus of claim 1, further comprising a second interferometer system coupled to the processor to determine a position of the stage in a second movement direction different from the first movement direction.

4. The apparatus of claim 3, wherein the second interferometer system comprises a respective measurement interferometer system and a respective reference interferometer system, the respective measurement interferometer system determining position of the stage relative to the process tool in the second movement direction, and the respective reference interferometer system providing reference data for the respective measurement interferometer system of the second interferometer system.

5. The apparatus of claim 3, wherein the second interferometer system is situated relative to the stage to determine a position of the stage in a direction substantially orthogonal to the movement direction, relative to the process position.

6. The apparatus of claim 3, wherein the second interferometer system comprises a respective reference interferometer system.

7. The apparatus of claim 6, wherein the respective reference interferometer systems of the first and second interferometer systems each produce at least one respective beam that reflects from a respective mirror associated with the process tool.

8. The apparatus of claim 6, wherein, with respect to the second interferometer system:
the respective reference interferometer system comprises a first reference interferometer and a second reference interferometer; and
the second reference interferometer is redundant to the first reference interferometer sufficiently to distinguish motion of the process tool relative to the process position from at least one other possible source of error in the determination of position of the stage in the second movement direction.

9. The apparatus of claim 6, wherein at least one of the respective reference interferometer systems includes a sheathed beam.

10. The apparatus of claim 3, wherein the processor is configured to determine a difference in data produced by the first and second interferometer systems based on respective frequency spectra of fluctuations exhibited by the first and second interferometer systems.

11. The apparatus of claim 1, further comprising a movement-measuring device situated relative to the process tool to determine a displacement of the process tool from the process position.

12. The apparatus of claim 1, wherein the processor and second reference interferometer distinguish motion of the process tool from motion of air through which at least one beam of the first interferometer system propagates.

13. The apparatus of claim 1, wherein at least one beam produced by the second reference interferometer is a sheathed beam.

14. The apparatus of claim 1, wherein, with respect to the first interferometer system:
beams of the respective measurement interferometer system, the first reference interferometer, and the second reference interferometer are in a plane;
the plane is parallel to a direction of flow of a gas through which the beams propagate; and
the processor is configured to attribute a fluctuation occurring simultaneously in beams of the first and second reference interferometers to a factor other than a density fluctuation in the gas flow.

15. The apparatus of claim 14 wherein the factor is a movement of the process tool relative to the process position.

16. The apparatus of claim 1, wherein the processor is configured to determine a difference in data produced by the first and second reference interferometers of the first interferometer system based on respective frequency spectra of fluctuation exhibited by the first and second reference interferometers.

17. A microlithography system, comprising a process apparatus as recited in claim 1.

18. A microlithography system, comprising:
an optical system;
a stage that is movable in at least a first movement direction relative to the optical system;
a stage-position-measurement interferometer system situated relative to the stage, the stage-position-measurement interferometer system producing at least one respective reference beam and at least one respective measurement beam, at least the measurement beam being directed in the first movement direction for reflection from a surface moving with the stage, the stage-position-measurement interferometer system producing, from interference of its reference and measurement beams, stage-position data concerning stage position in the first movement direction;
a first reference interferometer system situated relative to the optical system, the first reference interferometer system producing at least one respective reference beam and at least one respective measurement beam, at least the measurement beam being directed in the first movement direction for reflection from a surface associated with the optical system, the first reference interferometer system producing, from interference of its reference and measurement beams, first reference data for the stage-position data;
a second reference interferometer system situated relative to the optical system, the second reference interferometer system producing at least one respective measurement beam that is directed in the first movement direction for reflection from a surface associated with the optical system, the second reference interferometer system producing, from interference of its at least one measurement beam with a reference beam, second reference data for the stage-position data, the second reference data including data redundant to the first reference data; and
a processor connected to receive the stage-position data, the first reference data, and the second reference data from the interferometer systems, the processor being configured to determine, from the data, a position of the stage in the first movement direction relative to the optical system and to correct the determined position for displacement of the optical system.

19. The system of claim 18, wherein the processor is further configured to distinguish, from the data, a displacement of the optical system versus a presence of beam-perturbing air currents in at least one interferometer beam pathway.

20. The system of claim 18, further comprising a beam sheath enclosing at least the respective reference beam used by the second reference interferometer system.

21. The system of claim 18, further comprising a fluid-delivery system situated relative to the interferometer beams to flow a gaseous fluid across the respective beams of the interferometer systems, wherein the processor is further configured to correct the determined position for fluid-density fluctuations in at least one of the interferometer beams.

22. The system of claim 18, wherein the processor further comprises an adaptive filter to correct the determined position for fluid-density fluctuations in at least one interferometer-beam pathway.

23. The system of claim 22, wherein the adaptive filter distinguishes, from the data, a displacement of the optical system versus a presence of a fluid-density fluctuation in the measurement beam.

24. The system of claim 18, wherein:
the optical system comprises a projection lens; and
the stage comprises a substrate stage situated downstream of the projection lens.

25. The system of claim 18, further comprising:
a second stage-position-measurement interferometer system situated relative to the stage, the second stage-position-measurement interferometer system producing at least one respective reference beam and at least one respective measurement beam, the at least one respective measurement beam being directed in a second movement direction for reflection from the stage, the second stage-position-measurement interferometer system producing, from interference of its respective beams, respective data regarding stage position in the second movement direction; and a third reference interferometer system situated relative to the optical system to direct a respective beam in the second movement direction for reflection from the optical system and to produce respective reference interference data for the stage-position data produced by the second stage-position-measurement interferometer system;

wherein the processor is further connected to receive the stage-position data from the second stage-position-measurement interferometer system and the third reference interferometer system and to determine stage position in the second movement direction from the stage-position data.

26. The system of claim 25, wherein:

respective beams produced by the first stage-position-measurement interferometer system are parallel to each other;

respective beams produced by the second stage-position-measurement interferometer system are parallel to each other; and at least one of the first and second stage-position-measurement interferometer systems is arranged such that the processor determines, in addition to the stage position in the movement direction, yaw of the stage.

27. A microlithography system, comprising:

a first stage;

a lithography optical system situated relative to the first stage, wherein the first stage is movable relative to the optical system;

a first stage-position interferometer system situated relative to the first stage and comprising a first respective reference beam, a second respective reference beam, and at least one respective measurement beam, the at least one respective measurement beam reflecting from a surface movable with the stage, the reference beams reflecting from a surface on the optical system, and the second respective reference beam being redundant to the first respective reference beam;

an optical-system position-measurement device situated relative to the optical system; and a processor coupled and configured to receive respective data from the first stage-position interferometer system and from the optical-system position-measurement device, to use data from the optical-system position-measurement device to determine corrections based on optical-system movements, to apply the corrections to data from the first stage-position interferometer system to correct a position-measurement signal produced by the first stage-position interferometer system, and to correct data produced by the first respective reference beam according to data produced by the second respective reference beam.

28. The system of claim 27, wherein:

the optical-system position-measurement device comprises a respective interferometer system coupled to the processor and comprising a respective reference beam and a respective measurement beam; and at least the respective measurement beam is reflected from a surface associated with the optical system.

29. The system of claim 27, wherein the stage is a reticle stage.

30. The system of claim 27, wherein the stage is a substrate stage.

31. The system of claim 27, wherein the processor is further configured, based on data produced by the first reference beam of the first stage-position interferometer system and by the second reference beam of the first stage-position interferometer system, to distinguish motion of the first stage from air fluctuations in an optical path of the first and second reference beams.

32. The system of claim 27, further comprising:

a second stage situated and movable relative to the optical system; and a second stage-position interferometer system situated relative to the second stage and comprising at least one respective reference beam and at least one measurement beam, the at least one measurement beam being reflected from a surface movable with the second stage, the second stage-position interferometer system being coupled to the processor;

wherein the processor is further configured to use the corrected position-measurement signal to correct a synchronization error of relative motions of the first and second stages.

33. The system of claim 32, wherein the optical system is a projection-optical system situated between the first and second stages.

34. The system of claim 33, wherein:

the first stage is a reticle stage; and the second stage is a substrate stage.

35. In a process system, a method for determining position of a stage that is movable in at least one movement direction relative to a process tool situated at a process position, the method comprising:

using a position-measurement interferometer producing a beam reflecting from the stage and a first reference interferometer producing a beam reflecting from the process tool, interferometrically determining a position of the stage in the movement direction relative to the process tool;

using a second reference interferometer producing a beam reflecting from the process tool and producing data that is redundant to data produced by the first reference interferometer, determining displacement of the process tool from the process position;

comparing data produced by the second reference interferometer with corresponding data produced by the first reference interferometer to distinguish a first effect present in the data from both reference interferometers from a second effect present in the data from one but not from the other reference interferometer;

based on the distinguished first and second effects, determining an actual displacement of the process tool relative to the process position; and based on the determined actual displacement of the process tool, determining a position of the stage, relative to the process tool, corrected for the displacement of the process tool.

36. The method of claim 35, wherein the distinguished first effect is an effect of air currents in interferometer beam paths on the interferometric determination of the position of the stage.

37. In a lithography system, a method for determining position of a first stage that is movable in at least one movement direction relative to a reference position of an optical system of the lithography system, the method comprising:

directing at least one position-measurement beam of a stage-position-measurement interferometer system to the first stage, and directing at least a first reference beam of the stage-position-measurement interferometer system to the optical system to determine a position of the first stage in the movement direction relative to the optical system;

directing at least one beam of a first optical-system reference interferometer system along a pathway to and from the optical system to produce first reference data;

directing at least one beam of a second optical-system reference interferometer system, that is redundant to the first optical-system reference interferometer system, along a respective pathway to and from the optical system to produce second reference data;

comparing the first and second reference data;

producing, from the compared reference data, interferometric data on an extraneous displacement of the optical system relative to the reference position;

based on the interferometric data, determining data correction; and applying the data correction to the determined position of the first stage to determine a corrected position of the first stage relative to the reference position.

38. The method of claim 37, wherein:

the lithography system further comprises a second stage;

the second stage moves synchronously with the first stage relative to the reference position; and the corrected position of the first stage is used to correct a synchronization error of motion of at least one of the first and second stages relative to the other stage.

39. The method of claim 38, wherein:

the first stage is a reticle stage;

the second stage is a substrate stage; and the optical system is a projection-optical system situated between the reticle stage and the substrate stage.

* * * * *